US010879920B2

(12) United States Patent
Kassovski et al.

(10) Patent No.: US 10,879,920 B2
(45) Date of Patent: Dec. 29, 2020

(54) DEVICE AND METHOD FOR ABSOLUTE VOLTAGE MEASUREMENT

(71) Applicant: Melexis Technologies NV, Tessenderlo (BE)

(72) Inventors: Viktor Kassovski, Sofia (BG); Francois Piette, Neuville-en-Condroz (BE); Carl Van Buggenhout, Aalst (BE)

(73) Assignee: MELEXIS TECHNOLOGIES NV, Tessenderlo (BE)

( * ) Notice: Subject to any disclaimer, the term of this patent is extended or adjusted under 35 U.S.C. 154(b) by 0 days.

(21) Appl. No.: 16/577,822

(22) Filed: Sep. 20, 2019

(65) Prior Publication Data
US 2020/0099384 A1    Mar. 26, 2020

(30) Foreign Application Priority Data

Sep. 21, 2018 (EP) .................................. 18195910

(51) Int. Cl.
*H03M 1/06* (2006.01)
*G01R 19/32* (2006.01)
*H03M 1/10* (2006.01)
*H03M 1/12* (2006.01)

(52) U.S. Cl.
CPC .......... *H03M 1/0609* (2013.01); *G01R 19/32* (2013.01); *H03M 1/1071* (2013.01); *H03M 1/124* (2013.01)

(58) Field of Classification Search
None
See application file for complete search history.

(56) References Cited

U.S. PATENT DOCUMENTS 10,557,894 B2 * 2/2020 Lazarov ............. G01R 19/2503
2017/0074912 A1 * 3/2017 Draxelmayr .......... G01R 19/32
2017/0254839 A9   9/2017 Draxelmayr et al.

FOREIGN PATENT DOCUMENTS

WO          0227919 A2    4/2002

OTHER PUBLICATIONS

Makinwa, "Smart Temperature Sensors in Standard CMOS",Procedia Engineering, vol. 5, Sep. 5-8, 2010, pp. 930-939.
"Bandgap Voltage Reference," retrieved from https://en.wikipedia.org/wiki/Bandgap_voltage_reference, Sep. 16, 2019, 4 Pages.
European Search Report from EP Application No. 18195910, dated Mar. 7, 2019.

* cited by examiner

*Primary Examiner* — Lam T Mai
(74) *Attorney, Agent, or Firm* — Workman Nydegger

(57) ABSTRACT

A method and a circuit for measuring an absolute voltage signal, such that the circuit comprises: an A/D convertor, and a controller adapted for: a) obtaining a first digital reference value for a first reference signal having a positive temperature coefficient; b) obtaining a second digital reference value for a second reference signal having a negative temperature coefficient; c) obtaining a raw digital signal value for the signal to be measured, while applying a same reference voltage for step a) to c); and d) calculating the absolute voltage value in the digital domain using a mathematical function of the first and second digital reference value, and the raw digital signal value.

18 Claims, 14 Drawing Sheets

DEVICE AND METHOD FOR ABSOLUTE VOLTAGE MEASUREMENT

FIELD OF THE INVENTION

The present invention relates in general to the field of digitization methods and circuits, and more in particular to a method and circuit for performing an accurate absolute voltage measurement.

BACKGROUND OF THE INVENTION

The process of converting an analog signal into a digital value is known as "digitizing" or "digitization". A circuit for digitizing an analog signal is commonly referred to as an analog-to-digital convertor, abbreviated as "A/D convertor" or ADC.

Many variants of ADC's exist, for example in terms of resolution (number of bits), conversion speed, etc. They typically have an input port "ip" for receiving an analog signal to be digitized, and an output port "op" for providing the digital value (e.g. in serial or parallel form), and they all require a supply voltage "vdd", and a precise reference voltage "vref", as illustrated in FIG. 1.

It is well known that, for a given circuit topology and resolution (number of bits), the accuracy of the ADC highly depends on the precision and long-term stability of the reference voltage "vref". In order to reduce drift over time, in practice, nearly always a so called "bandgap-voltage" is used. The concept of "bandgap voltage reference" is well known in the art, and is well documented. At the time of writing this application, an introduction can be found for example on https://en.wikipedia.org/wiki/Bandgap_voltage_reference, but many other documents and tutorials exist.

In order to understand the principles of the present invention, it suffices to know that a "bandgap voltage" is typically made by amplifying a so called PTAT (Proportional to Absolute Temperature) voltage (or current), and summing the result with a CTAT (Complementary to Absolute Temperature) voltage (or current). It is known that the temperature influence can be largely compensated by using an appropriate multiplication factor, at least in first order. Over the years, many improvements are proposed to linearize the temperature dependence, or to widen the temperature range.

The present invention however is not particularly concerned with drift of the digitization method and circuit due to temperature variations but is primarily concerned with drift due to mechanical stress, for example caused by packaging (e.g. plastic molding) or due to soldering.

SUMMARY OF THE INVENTION

It is an object of embodiments of the present invention to provide a method and a circuit for providing a digital value for an analog signal to be digitized, or in other words, a method and a circuit for measuring an absolute voltage signal. It is also an object of embodiments of the present invention to provide a device comprising such a circuit and a sensor circuit.

It is a particular object of embodiments of the present invention to provide a method and a circuit for measuring an absolute voltage signal with a reduced sensitivity to mechanical stress.

It is a particular object of embodiments of the present invention to provide a method and a circuit for measuring an absolute voltage signal with a reduced drift related to mechanical stress.

It is an object of particular embodiments of the present invention to provide a method and a circuit for measuring an absolute voltage signal using fewer components and/or occupying less space on a semiconductor substrate.

It is an object of particular embodiments of the present invention to provide a method and a circuit for accurately measuring an absolute voltage signal in an environment having a temperature from about 20° C. to about 60° C.

It is an object of particular embodiments of the present invention to provide a method and a circuit for accurately measuring an absolute voltage signal in an environment having a temperature from −20° C. to +120° C., with an absolute accuracy corresponding to a temperature variation of at most ±0.5° C., including variations due to mechanical stress.

It is an object of particular embodiments of the present invention to provide a method and a circuit for accurately measuring an absolute voltage signal in an environment having a temperature from −50° C. to +170° C., with an absolute accuracy corresponding to a temperature variation of at most ±0.2° C., including variations due to mechanical stress.

These objectives are accomplished by a circuit and a method and a device according to embodiments of the present invention.

According to a first aspect, the present invention provides a circuit for providing a digital value for an analog signal to be digitized, the circuit comprising: at least one A/D convertor having a reference port for receiving a reference voltage vref, and an input port for receiving an analog voltage to be digitized; a controller adapted for: a) applying a first reference signal having a positive temperature coefficient to the input port of the at least one A/D convertor while applying a reference voltage to the reference port of the at least one A/D convertor, and obtaining a first digital reference value from the at least one A/D convertor; b) applying a second reference signal having a negative temperature coefficient to the input port of the at least one A/D convertor while applying the same reference voltage as was used in step a) to the reference port of the at least one A/D convertor, and obtaining a second digital reference value from the at least one A/D convertor; c) applying the analog signal to be measured or a signal derived therefrom to the input port of the at least one A/D convertor while applying the same reference voltage as was used in step a) to the reference port of the at least one A/D convertor, and obtaining a raw digital signal value from the at least one A/D convertor; d) calculating the digital value for the analog signal to be digitized in the digital domain using a mathematical function of the first digital reference value, and the second digital reference value, and the raw digital signal value.

This circuit can be used to perform an absolute voltage measurement.

It is a major advantage of this circuit that it calculates the digital value in the digital domain based on a digital representation of the first and second reference value, because an amplification in the digital domain does not suffer from offset and gain variations, in contrast to amplification in the analog domain.

It is a major advantage of this circuit that the accuracy of the result does not rely on the long-term stability of the reference voltage (vref) applied to the ADC(s).

It is a major advantage of this circuit that it is highly insensitive to mechanical stress, for example stress caused by packaging and/or soldering. Tests have shown that the sensitivity to mechanical stress is typically reduced by a factor of 2.0 or more, as compared to a classical solution where an analog bandgap voltage is applied to an ADC (e.g. as shown in FIG. 1).

It is another major advantage that the solution provided by the present invention does not require complex circuitry for regulating or adjusting the analog reference voltage (vref) which is applied to the at least one ADC. In fact, the accuracy of the result provided by circuits according to the present invention is insensitive to drift of the reference voltage (e.g. bandgap voltage) over time. According to the present invention, it suffices that the reference voltage applied to the ADC is substantially constant (short term stability) during the three measurements, but its absolute value is allowed to deviate far from the value used during calibration.

It is noted that the solution provided by the present invention goes against the common believe that a very precise digitization can only be obtained using an ADC with a very precise reference voltage.

As will become clear further, several embodiments using these principles are envisioned.

The reference voltage (e.g. bandgap voltage) and the two reference signals (one with a positive temperature coefficient and one with a negative temperature coefficient) may be generated inside the circuit itself or may be provided from outside of the circuit.

With "circuit" is meant an electronic circuit or an electronic sub-circuit. In preferred embodiments, the circuit is part of an integrated semiconductor device (also known as an IC).

The reference voltage needs to be "substantially constant" during the three measurements of step a) to step c). With "the same" reference voltage is typically meant within a tolerance margin corresponding to 1 LSB (least significant bit) of the output.

It is noted that the steps a), b) and c) need not be performed in this particular order but can be performed in any order.

It is noted that, in this embodiment, the blocks for generating the first reference signal and second reference signal and the reference voltage are not necessarily part of the claimed circuit but may be applied from the outside.

Preferably step a) to c) are performed within 1.0 second.

With "or a signal derived therefrom" is for example meant an amplified (e.g. a linearly amplified) or attenuated (e.g. a linearly attenuated) or a low-pass filtered version of said signal.

In an embodiment, the mathematical function can be expressed as a ratio of two first order polynomials of the first digital reference value (e.g. VPTAT), and the second digital reference value (e.g. VBE), and the raw digital signal value (e.g. VIN).

In an embodiment, step d) comprises calculating the digital value for the analog signal to be digitized using the following formula or an equivalent formula:

$$VABS=(C*VIN/V1)/[(\alpha*VPTAT/V2)+(VBE/V3)]$$

wherein VABS is a digital representation of the absolute voltage of the analog signal to be digitized, and VPTAT is the first digital reference value, and VBE is the second digital reference value, and VIN is the raw digital signal value, and V1, V2, V3 are digital values obtained by measurement using the at least one analog to digital convertor.

In an embodiment, one or more of the values X, Y and Z may be equal to 1.000, depending on the specific topology of the circuit. It is an advantage of this embodiment that the processor or controller only needs to be able to do very simple arithmetic: only a small number of multiplications, divisions and summations or subtractions, but no goniometric function or exponential function for example.

It is an advantage of this embodiment that the function does not require for example an exponential function, or a power function, or a goniometric function, or a square root or the like, but only requires basic functions which can be performed by a relatively simple arithmetic unit (ALU) or a simple microcontroller, for example a 12-bit or 14-bit or 16 bit or 18-bit or 20-bit micro-controller, without having to use a look-up table or without having to use an iterative approach to calculate for example a square root function.

Preferably the controller or processor or arithmetic unit is capable of performing floating point operations.

In an embodiment, the circuit further comprises: a first reference block for providing the first reference signal having the positive temperature coefficient, and a second reference block for providing the second reference signal having the negative temperature coefficient, and a third reference block for providing the reference voltage.

Preferably the first reference block is adapted for providing a so called "proportional to absolute temperature" or PTAT voltage, and preferably the second reference block is adapted for providing a so called "complementary to absolute temperature" or CTAT voltage.

The third reference block may be adapted to provide a bandgap voltage, but that is not absolutely required. It suffices that the reference voltage is sufficiently stable to qualify as "the same" during a short time period, namely during the duration of the three measurements of step a) to step c). In preferred embodiments of the present invention, the term "the same reference voltage" is to be interpreted as "constant within a predefined tolerance margin, e.g. a tolerance margin corresponding to a variation of at most 1 LSB at the output of the ADC (for a fixed input voltage).

In an embodiment, the third reference block is adapted for providing a bandgap voltage as the reference voltage; and/or the third reference block comprises a sample-and-hold block (abbreviated as S&H) having an input adapted for receiving a voltage, and having an output connected to the reference port of the at least one ADC, and wherein the controller is further adapted for configuring the sample-and-hold block to capture a sample of said voltage before performing step a) to c), and for holding this value while performing step a) to c).

In the first option, the reference voltage has long term stability over time, hence is also sufficiently stable during the short time of the three measurements.

In the second option, a suitable voltage level is chosen (e.g. between 70% and 90% of the supply voltage), and this voltage level is sampled, and kept the same by a sample-and-hold block, and applied as a reference voltage to the ADC. It is an advantage of this embodiment that no "bandgap voltage" is required, and that in fact any other suitable voltage may be used instead, for example a voltage generated by a simple voltage divider comprising or consisting of two resistors connected in series, one end of the resistors connected to ground, the other end of the resistors connected to the supply voltage.

In an embodiment, the circuit further comprises a routing network adapted for selective routing the first reference signal having a positive temperature coefficient, and the second reference signal having a negative temperature coefficient, and the analog signal to be digitized to said at least one input port; and the controller is further adapted for: configuring the routing network to route the first reference signal to the input port of the at least one A/D convertor in step a); and for configuring the routing network to route the second reference signal to the input port of the at least one A/D convertor in step b); and for configuring the routing network to route the analog signal to be measured or a signal derived therefrom to the input port of the at least one A/D convertor in step c).

In an embodiment, the controller is adapted for performing step a) and b) at a first frequency, and for performing step c) and d) at a second frequency at least 5 times higher than the first frequency.

It is an advantage of this embodiment that the "overhead" of step a) and b) can be spread over multiple samples taken in step c) and converted into absolute voltage values in step d), which can be used if the reference voltage applied to the ADC is sufficiently stable over the prolonged period of time. The addition of a S&H circuit may be highly advantageous in this respect, especially if the reference voltage is generated from outside of the chip, or comes from another die inside the same package, but the signal could be disturbed.

In an embodiment, the circuit contains a single ADC; and step d) comprises calculating the digital value for the analog signal to be digitized using the following formula or an equivalent formula:

$$VABS=C*VIN/(\alpha*VPTAT+VBE)$$

wherein VABS is a digital representation of the absolute voltage of the analog signal to be digitized, and wherein VPTAT is the first digital reference value, and VBE is the second digital reference value, and VIN is the raw digital signal value, and $\alpha$ and C are predetermined constants.

The value of the constant "$\alpha$" is preferably determined during a calibration test, for example as the absolute value of the ratio of the negative temperature coefficient and the positive temperature coefficient. It is an advantage of using this value for "$\alpha$" because it makes the denominator of the formula substantially insensitive for temperature variations (around an envisioned working point). This denominator is also referred to herein as the "virtual reference" value, abbreviated herein as VR.

The value of the constant "C" is preferably also determined during calibration. This value corresponds to the factor by which the value "VIN/VR" needs to be multiplied in order to obtain the absolute voltage value.

It is noted that the reference voltage "vref" applied to the ADC during calibration may be different from the reference voltage as used afterwards during actual use. In order to perform an accurate absolute voltage measurement, it is sufficient that the weighted sum of the first and second reference signal (e.g. vptat and vbe) are the same during calibration and during later use.

It is an advantage of this embodiment that only a single ADC is required, and no DAC, thus requiring less space on semiconductor substrate (in case of an integrated chip).

It is an advantage of this embodiment that only three measurements are required in order to calculate the absolute voltage of the input signal.

It is an advantage of this embodiment that the routing network can be very simple (as described next).

In an embodiment, the routing network comprises or consists of a three-way multiplexer, having a first input for receiving the first reference signal, a second input for receiving the second reference signal, a third input for receiving the analog voltage signal to be digitized, and an output operatively connected to the input port of the analog-to-digital converter, and wherein the controller is further adapted for configuring the three-way multiplexer.

In an embodiment, the routing network comprises a first tri-state buffer having an input for receiving the first reference signal (vptat), and a second tri-state buffer having an input for receiving the second reference signal (vbe), and a third tri-state buffer having an input for receiving the analog voltage signal (vin) to be digitized, each of the first, second and third buffer having an output operatively connected to the input port of the analog-to-digital converter (ADC), and wherein the controller is further adapted for configuring the three tri-state buffers.

It is an advantage of these routing networks that each of the paths has unity gain, hence no extra measurements need to be done to determine the gain or amplification or attenuation factor, keeping the method and the formula very simple.

In an embodiment, the circuit comprises a first A/D convertor and a second A/D convertor and a third A/D convertor, each having a respective reference port adapted for receiving the same reference voltage; and the circuit further comprises an attenuator circuit adapted for attenuating the reference voltage and for providing an attenuated signal; and the routing network is adapted for selectively routing one of the first reference signal and the attenuated signal to the first A/D convertor, and for selectively routing one of the second reference signal and the attenuated signal to the second A/D convertor, and for selectively routing one of the analog voltage signal to be digitized and the attenuated signal to the third A/D convertor; and the controller is further adapted for: e) configuring the routing network to route the attenuated signal to the input port of the first A/D convertor, and obtaining a first attenuation value while applying the same reference voltage as used in step a) to step c) to the reference port of the first A/D convertor; f) configuring the routing network to route the attenuated signal to the input port of the second A/D convertor, and obtaining a second attenuation value while applying the same reference voltage as used in step a) to step c) to the reference port of the second A/D convertor; g) configuring the routing network to route the attenuated signal to the input port of the third A/D convertor, and for obtaining a third attenuation value while applying the same reference voltage as used in step a) to step c) to the reference port of the third A/D convertor; and step d) comprises calculating the digital value for the analog signal to be digitized using the following formula or an equivalent formula: VABS=C*(VIN/VX3)/[$\alpha$*(VPTAT/VX1)+(VBE/VX2)], wherein VABS is a digital representation of the absolute voltage of the analog signal (vin) to be digitized, and wherein VPTAT is the first digital reference value, and VBE is the second digital reference value, and VIN is the raw digital signal value, and VX1 is the first attenuation value, and VX2 is the second attenuation value, and VX3 is the third attenuation value, and $\alpha$ and C are predetermined constants.

It is an advantage of this embodiment that multiple ADCs can be used (if desired), and that an accurate value for the digitized voltage can still be obtained even if the two reference signals (vptat and vbe) and the analog input signal (vin) are measured by different ADCs, even if these ADCs have a different gain, by performing three additional measurements, where a same signal "vx" is measured through each of the three ADC's.

It is an advantage of using an attenuated version of the analog reference signal "vref", for example in the range from about 50% to about 95% of this signal, because the reference signal has a high short-term stability, hence also the attenuated signal has a high short-term stability, and is guaranteed not to cause overflow or clipping of the ADC.

In an embodiment, the routing network comprises: a first multiplexer or a first set of tri-state buffers adapted for selectively routing one of the first reference signal "vptat" and the attenuated signal to the first A/D convertor; and a second multiplexer or a second set of tri-state buffers adapted for selectively routing one of the second reference signal "vbe" and the attenuated signal to the second A/D convertor; and a third multiplexer or a third set of tri-state buffers adapted for selectively routing one of the analog voltage to be digitized and the attenuated signal to the third A/D convertor.

In an embodiment, the circuit contains a single ADC; and the circuit further comprises an analog amplifier adapted for amplifying the analog voltage to be digitized; and the circuit further comprises an attenuator circuit adapted for attenuating the reference voltage thereby providing an attenuated signal; and the routing network is adapted for selectively routing the first reference signal through a first path with unity gain to the A/D convertor for obtaining the first reference value in step a), and for selectively routing the second reference signal through a second path with unity gain to the A/D convertor for obtaining the second reference value of step b), and for selectively routing the analog voltage signal to be digitized through a third path containing the amplifier to the A/D convertor for obtaining the raw digital signal value of step c), and for selectively routing the attenuated signal through a fourth path with unity gain to the A/D convertor for obtaining a first attenuation value, and for selectively routing the attenuated signal through a fifth path containing the amplifier to the A/D convertor for obtaining a second attenuation value; and the controller is further adapted for: e) configuring the routing network to route the attenuated signal through said fourth path, and obtaining the first attenuation value while applying the same reference voltage as used in step a) to step c) to the reference port of the A/D convertor and to an input of the attenuator; f) configuring the routing network to route the attenuated signal through said fifth path, and obtaining the second attenuation value while applying the same reference voltage as used in step a) to step c) to the reference port of the A/D convertor and to an input of the attenuator; and step d) comprises calculating the digital value for the analog signal to be digitized using the following formula or an equivalent formula:

$$VABS=C*VIN*(VX/VY)/(\alpha*VPTAT+VBE)$$

wherein VABS is a digital representation of the absolute voltage of the analog signal to be digitized, and wherein VPTAT is the first digital reference value, and VBE is the second digital reference value, and VIN is the raw digital signal value, and VX is the first attenuation value, and VY is the second attenuation value, and α and C are predetermined constants.

It is an advantage of this embodiment that a very small signal "vin" can be accurately digitized.

It is a major advantage of this embodiment that the actual gain of the amplifier A is not important for the accuracy of the measurement, and may thus drift over time. The same applies for the gain of the attenuator K. This strongly reduces the requirements imposed on the design of the amplifier and the attenuator and makes the circuit and method highly insensitive to mechanical stress. What is important for the accuracy is that the gain of the amplifier and the gain of the attenuator is constant during the steps c), e) and f) described above, which only requires a short-term stability, which is much easier to implement.

It is an advantage of this embodiment that only a single ADC is required, and no DAC, and thus saves space on a semiconductor substrate (if implemented in an integrated chip).

Preferably the inverse of the gain of the attenuator is higher than the gain of the amplifier, in order to prevent overflow or clipping of the ADC. For example, if A is about 50, then 1/K is preferably larger than 50, but the invention will also work if K is larger than 60 or larger than 70, thus allowing huge drift of the attenuator and the amplifier.

In an embodiment, the at least one ADC has a resolution of at least 12 bits.

In an embodiment, the at least one ADC has a resolution of at least 14 bits.

In an embodiment, the at least one ADC has a resolution of at least 16 bits.

According to a second aspect, the present invention also provides a device comprising: a sensor circuit adapted for measuring a physical quantity and for providing an analog sensor signal related to said physical quantity; and a circuit according to the first aspect for digitizing said analog sensor signal, and for calculating the absolute voltage value indicative of a magnitude of said physical quantity.

In an embodiment, the device is a handheld pressure sensor device.

In an embodiment, the device is a handheld temperature sensor device.

In an embodiment, the device further comprises a display; and the controller is further adapted for driving the display or configuring the display or sending information to the display for generating a visible representation of the digital value.

The display may be a graphical display, or an alphanumerical display. For example, the display may contain a plurality of 7-segment displays (abbreviated as SSD).

According to a third aspect, the present invention also provides a computer implemented method of determining a digital value for an analog signal to be digitized, as can be performed by a controller as a part of a circuit that further comprises at least one A/D convertor having a reference port for receiving a reference voltage, and an input port for receiving an analog voltage to be digitized; the method comprising: a) providing a first reference signal having a positive temperature coefficient to the input port of the at least one A/D convertor, and applying a reference voltage to the reference port of the at least one A/D convertor, and obtaining a first digital reference value from the at least one A/D convertor; b) providing a second reference signal having a negative temperature coefficient to the input port of the at least one A/D convertor, and applying the same reference voltage to the reference port of the at least one A/D convertor, and obtaining a second digital reference value from the at least one A/D convertor; c) providing the analog signal to be measured or a signal derived therefrom to the input port of the at least one A/D convertor, and applying the same reference voltage to the reference port of the at least one A/D convertor, and obtaining a raw digital signal value from the at least one A/D convertor; d) calculating the digital value for the analog signal to be digitized in the digital domain as a mathematical function of the first digital reference value, and the second digital reference value, and the raw digital signal value.

With "or a signal derived therefrom" is for example meant an amplification or attenuation or a low-pass filtered version of said signal.

In an embodiment, step d) comprises calculating the digital value for the analog signal to be digitized using the following formula or an equivalent formula:

$$VABS=(C*VIN/V1)/[(\alpha*VPTAT/V2)+(VBE/V3)]$$

wherein VABS is a digital representation of the absolute voltage of the analog signal to be digitized, and VPTAT is the first digital reference value, and VBE is the second digital reference value, and VIN is the raw digital signal value, and V1, V2, V3 are digital values obtained by measurement using the at least one analog to digital convertor.

In an embodiment, the circuit contains a single ADC; and step d) comprises calculating the digital value for the analog signal to be digitized using the following formula or an equivalent formula: $VABS=C*VIN/(\alpha*VPTAT+VBE)$, wherein VABS is a digital representation of the absolute voltage of the analog signal to be digitized, and wherein VPTAT is the first digital reference value, and VBE is the second digital reference value, and VIN is the raw digital signal value, and $\alpha$ and C are predetermined constants.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

BRIEF DESCRIPTION OF THE DRAWINGS

FIG. 9(a) shows a measurement error when using the classical ADC measurement approach (e.g. as explained in FIG. 1).

FIG. 9(b) shows a measurement error when using a circuit and method according to the present invention (e.g. as explained in FIG. 3 and FIG. 4).

FIG. 9(c) shows a typical drift of the analog reference voltage vref, under mechanical stress.

FIG. 9(d) shows a typical drift of the so called "virtual reference" VR according to aspects of the present invention.

FIG. 11(a) shows % drift of the bandgap voltage vref versus pressure exerted on the device in a first direction (X-direction), parallel to the plane of the substrate.

FIG. 11(b) shows % drift of the bandgap voltage vref versus pressure exerted on the device in a second direction (Z-direction), perpendicular to the plane of the substrate.

FIG. 11(c) shows % drift of the virtual reference value VR versus pressure exerted on the device in the first direction (X-direction).

FIG. 11(d) shows % drift of the virtual reference value VR versus pressure exerted on the device in the second direction (Z-direction).

Figure 1:
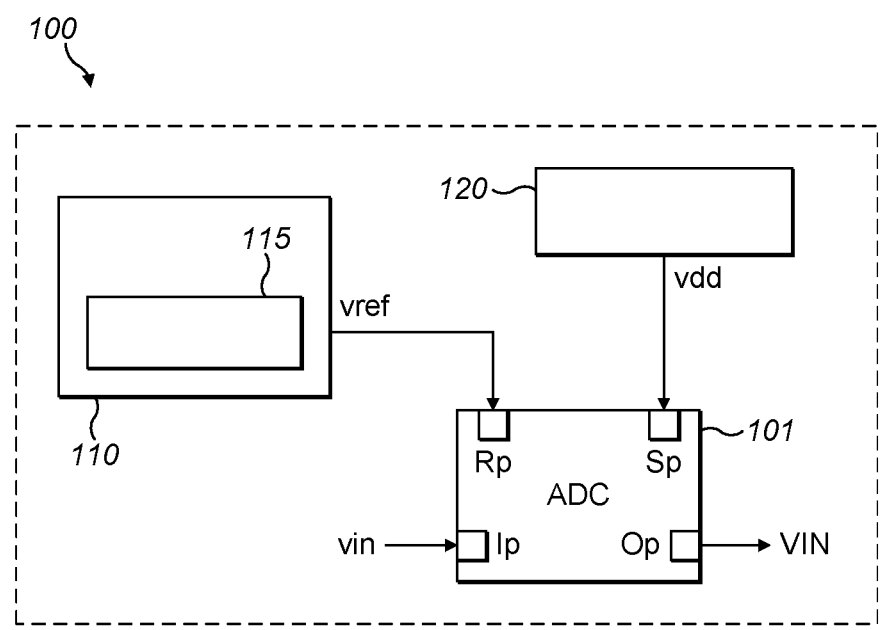
FIG. 1 is a block-diagram showing a classical arrangement of an ADC.

The drawings are only schematic and are non-limiting. In the drawings, the size of some of the elements may be exaggerated and not drawn on scale for illustrative purposes. Any reference signs in the claims shall not be construed as limiting the scope. In the different drawings, the same reference signs refer to the same or analogous elements.

DETAILED DESCRIPTION OF ILLUSTRATIVE EMBODIMENTS

The present invention will be described with respect to particular embodiments and with reference to certain drawings, but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

In this document, the abbreviation ADC or A/D convertor means "analog-to-digital convertor".

In this document, the abbreviation PTAT means "Proportional to Absolute Temperature", which is a special case of a characteristic with a "positive temperature coefficient", meaning that the value increases with increasing temperature.

In this document, the abbreviation CTAT means "Complementary to Absolute Temperature", which is a special case of a characteristic with a "negative temperature coefficient", meaning that the value decreases with increasing temperature.

In this document, the expression "absolute voltage" refers to a voltage magnitude which is to be considered per se, such as for example the voltage generated by a thermopile, as opposed to a "relative voltage" generated for example by a bridge circuit (e.g. a Wheatstone bridge), where unbalance of the bridge is to be considered as a percentage of the supply voltage applied to the bridge.

In this document, the abbreviation "LSB" means Least Significant bit. For a 12 bit ADC, a variation of vref by about 61 ppm results in a variation of the output by 1 LSB.

In this document, lower case letters (e.g. vref, vin, vptat, vbe, vx) are typically used to indicate analog voltage levels or analog voltage signals, whereas uppercase letters (e.g. C, VIN, VPTAT, VBE) are typically used to indicate digital values, to facilitate the reading.

A problem underlying the present invention is the need for a circuit that can perform an accurate absolute voltage measurement and provide the result as a digital value, in a manner which is less sensitive to mechanical stress.

FIG. 1 shows a classical solution, for converting an analog voltage signal "vin" into a digital value "VIN", using an analog-to-digital convertor circuit.

As is well known in the art, in order to obtain an accurate digital value using the circuit of FIG. 1, it is crucial to use a reference voltage "vref" which is as stable and as clean as possible during the lifetime of the device, and as much as possible insensitive to temperature variations, supply voltage variations, humidity variations, mechanical stress, etc. In practice typically a "bandgap voltage" is the most commonly used on-chip reference voltage, because it provides a voltage which is relatively stable over a given temperature range.

In fact, the block-diagram of FIG. 1 in combination with a bandgap voltage as the reference voltage to the ADC is so widespread that it can be stated that it is a "common believe" that a very precise digitization can only be obtained using an ADC with a very precise reference voltage.

Figure 2:
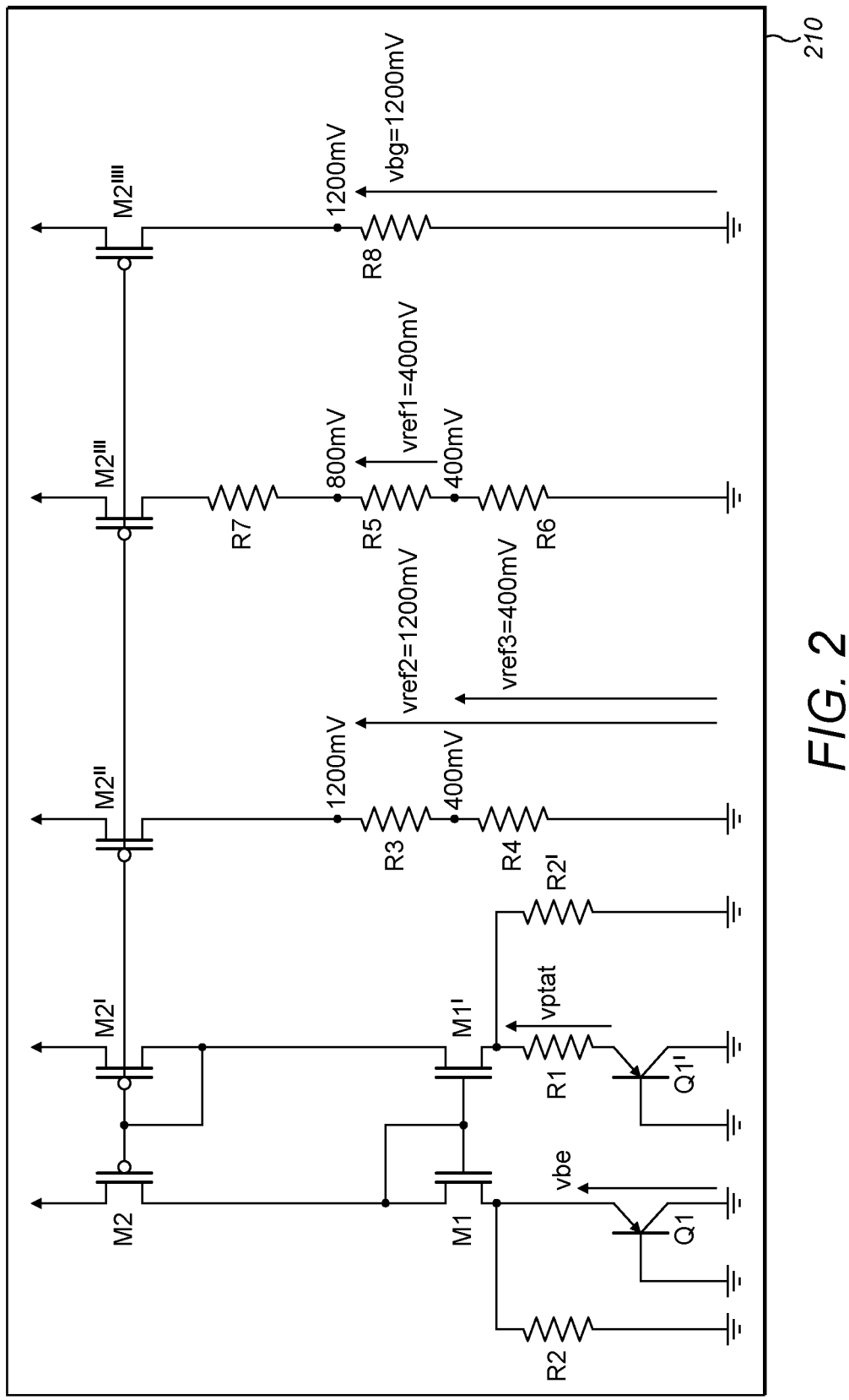
FIG. 2 shows an exemplary circuit (referred to herein as "reference block") for generating reference signals (e.g. a ptat voltage and a ctat voltage and one or more reference voltages), as can be used in embodiments of the present invention.

FIG. 2 shows an exemplary reference block or reference voltage generator circuit 210, as may be used to generate a reference voltage to be applied to the reference port of the ADC of FIG. 1, but of course the present invention is not limited to this particular reference block, but is merely shown as an example to explain the principles of the present invention, without limiting the invention thereto.

The components R1 to R8 represent resistors, the components M1 and M1' are matched CMOS transistors (according to a certain ratio), the components M2, M2', M2", M2''' and M2'''' are matched CMOS transistors (according to a certain ratio), and the components Q1 and Q1' are matched bipolar transistors (according to a certain ratio).

The working of a bandgap circuit is well known in the art, and therefore need not be explained in full detail here. It suffices to know that a bandgap circuit comprises analog components, such as resistors, bipolar transistors and/or CMOS transistors, which are "matched" to each other (e.g. by laser-trimming), and that a bandgap voltage is typically generated in the analog domain as a summation or subtraction of two analog voltages: the first analog voltage being a voltage having a positive temperature coefficient, usually a PTAT voltage (Proportional To Absolute Temperature) which is amplified by a certain gain, the second analog voltage being a voltage having a negative temperature coefficient, usually a CTAT voltage (Complementary To Absolute Temperature), for example a base-emitter voltage of bipolar transistors or a forward diode voltage. Ideally, the bandgap reference voltage is a voltage having a magnitude which can be expressed by the following formula:

$$vref = \alpha \cdot vptat + vbe \qquad [1]$$

where vref is the voltage level (or amplitude) of the bandgap voltage, α·vptat is the voltage level of the amplified ptat-voltage, and vbe is a base-emittor voltage. The value of α is constant and is typically chosen in the range from about 8.00 to about 12.00, depending on the selected topology of the circuit, and/or the intended operating temperature range. Thus, in order to create the analog bandgap voltage vref according to formula [1], an analog amplification by "α" and an analog summation is needed.

The inventors realized that a bandgap voltage vref has several sources of imperfection and instability, not only caused by variations of vptat and vbe but also related to variations of the multiplication by "α". They realized that an (analog) amplifier always has two error sources: offset error and gain error. Therefore, in reality, when making an analog bandgap voltage vref, the actual reference voltage vref thus made does not satisfy equation [1], but should rather be written as follows:

$$vref = \alpha \times \left(1 + \frac{\Delta\alpha}{\alpha}\right) \times vptat \times \alpha \times vos + vbe \quad [2]$$

where vref is the voltage level (or amplitude) of the bandgap voltage, vptat is the voltage level of the ptat-voltage, vbe is a base-emitter voltage, a is the amplifier gain, $\Delta\alpha/\alpha$ is the relative gain error, and vos is the offset error.

The imperfections of the vptat and vbe voltage themselves can be reduced, and their stability improved by specific design and layout techniques such as e.g. Dynamic Element Matching (DEM), choosing less sensitive configurations and components etc., but these are not the focus of the present invention. Instead, the main focus of the present invention is directed to addressing imperfections and deviations related to the multiplication by "α".

The inventors came to the idea of performing this multiplication in the digital domain rather than in the analog domain. The method involves digitizing the vptat voltage resulting in a numerical value VPTAT, and digitizing the vbe voltage resulting in a numerical value VBE, and calculating a digital value VR as α×VPTAT+VBE, but they realized that if the reference voltage vref changes, also the value for VR changes, which in itself does not solve the problem, because the dependency on the reference voltage remains.

While it would be technically possible to use the value VR to adjust the analog reference voltage generator, the inventors realized that such approach would require a circuit with a digital-to-analog convertor (DAC), and thus require additional circuitry, but moreover, a DAC typically suffers from many of the same issues as an ADC, inter alia that it comprises matched components which drift with mechanical pressure.

The inventors decided to follow a radically different approach. Contrary to the common believe that a very precise digitization can only be obtained using an ADC with a very precise reference voltage, they came to the idea to deliberately also digitize the data input signal "vin" using the "incorrect" or "drifted" reference voltage vref, resulting in an "incorrect" value VIN, and they surprisingly found that a correct value for the input signal can be calculated in the digital domain, using a function of the (incorrect) value VPTAT and the (incorrect) value VBE and the (incorrect) value VIN, and using one or more constants.

Several embodiments based on this principle are possible, a few of which will be described in FIG. 3 to FIG. 8, but the present invention is not limited to only these circuits, and the skilled person having the benefit of the present disclosure can easily come up with other variants using the same principles.

Tests have shown that the results obtained via this approach reduces the impact of mechanical stress by at least a factor 2, as will be illustrated in FIG. 9(a) to FIG. 11(d).

More specifically, (and referring for example to FIG. 3), the present invention provides a circuit for providing a digital value VABS for the analog signal vin to be digitized. The circuit comprises at least one A/D convertor and a digital controller (e.g. a microcontroller or a microprocessor). The at least one A/D convertor has a reference port "rp" for receiving a reference voltage "vref", and an input port "ip" for receiving an analog voltage "vin" that needs to be measured or to be digitized.

In contrast to the prior art, where a digital value for the input signal vin is obtained by a single measurement, the controller used in the present invention is adapted for performing three measurements using the ADC to thereby obtain three digital values VPTAT, VBE and VIN, and to then calculate the actual value VABS based on a mathematical function of these three values. More specifically, the controller is adapted for performing the following steps:

a) providing or routing a first reference signal (e.g. a ptat voltage) having a positive temperature coefficient to the input port "ip" of the at least one ADC, while a reference voltage vref (e.g. a bandgap voltage) is applied to the reference port "rp" of the at least one ADC, and obtaining a first digital reference value VPTAT from the at least one ADC;

b) providing or routing a second reference signal having a negative temperature coefficient (e.g. a ctat voltage, e.g. a base-emitter voltage of a bipolar transistor vbe or a forwardly biased diode voltage) to the input port of the at least one ADC while the same reference voltage vref as was used in step a) is applied to the reference port "rp" of the at least one ADC, and obtaining a second digital reference value VBE from the at least one ADC;

c) providing or routing the analog signal to be measured "vin", or a signal vin' derived therefrom (e.g. an amplified version thereof) to the input port "ip" of the at least one ADC while the same reference voltage "vref" as was used in step a) and step b) is applied to the reference port "rp" of the at least one ADC, and obtaining a raw digital signal value VIN from the at least one ADC;

d) calculating the digital value VABS indicative of the absolute voltage of the analog signal vin to be digitized, in the digital domain using a mathematical function of the first digital reference value VPTAT and the second digital reference value VBE and the raw digital signal value VIN.

The present invention also provides a method comprising the steps a) to d) described above, as can be performed by a controller of a circuit that comprises at least one A/D convertor.

As mentioned above, it is an advantage of this solution that it calculates the value of the absolute voltage VABS in the digital domain, because multiplications and/or summations in the digital domain do not suffer from offset error and gain error.

It is also an advantage of this solution that the accuracy of the result does not rely on the precision of the reference voltage (vref), which cancels from the equation, the reason being that the equation is a ratio of two first order polynomials in the digital values VPTAT, VBE and VIN. While the precision of the absolute voltage VABS depends on the digital values VPTAT and VBE, it does not depend on these values individually, but on a kind of weighted average of these values, combined in a manner in which the positive and negative temperature dependence are substantially cancelled.

It is also an advantage of this solution that the result is highly insensitive to mechanical stress, in particular stress caused by packaging and/or soldering, because mechanical stress cannot cause gain error or offset error of the mathematical formula, in contrast to the prior art, where mechanical stress does vary the bandgap voltage, albeit slightly.

It is also an advantage that the solution does not require additional circuitry for regulating or adjusting the analog reference voltage (vref), thus avoiding inter alia the addition of a DAC.

Referring now to the Figures.

FIG. 1 is a block-diagram showing a classical arrangement of an ADC. As described above, the ADC circuit typically has an input port "Ip" where an analog signal to be digitized is applied, and a reference port "Rp" where a reference voltage (typically a bandgap voltage) is applied, and a supply port "Sp" where a supply voltage is applied (which is usually omitted from most drawings), and an output port "Op" for providing a digital value corresponding to the analog input signal.

More specifically, the circuit 100 shown in FIG. 1 comprises:
a voltage generator 120 for providing a supply voltage vdd (e.g. 5.0V or 3.3V or 1.8V or any other suitable voltage);
an ADC 101 having an input port Ip for receiving an analog signal "vin" to be digitized, and a reference port Rp for receiving a (stable) reference voltage "vref", and a supply port Sp for receiving the supply voltage "vdd", and an output port Op for providing the digitized value VIN;
a reference voltage generator circuit 110 comprising a bandgap voltage generator circuit 115 for providing said reference voltage "vref".

FIG. 2 shows an exemplary reference block 210 for generating one or more reference signals vptat, vbe and/or a reference voltage vref as may be used in embodiments of the present invention. As discussed above, in order to obtain a bandgap voltage vref which is highly insensitive to drift, it is important that certain analog components are matched. But even if the layout is perfect, and the components are ideally matched (e.g. by laser-trimming), packaging of the integrated circuit (e.g. by plastic moulding) causes mechanical stress, which may cause imbalance of matched components, and in particular may cause gain error and/or offset error of an amplifier implemented using said components. While such deviations can be partly addressed by a calibration test, mechanical stress variations caused after the calibration, for example due to soldering of the packaged chip on a printed circuit board (PCB), or mechanical stress variations due to drift over time, are not compensated. It would therefore be ideal that the proposed solution has an inherently reduced sensitivity to mechanical stress.

The particular circuit 200 shown in FIG. 2 is adapted for providing:
a first reference signal vptat;
a second reference signal vbe;
three reference voltages vref1, vref2, vref3 of 400 mV, 1200 mV and 400 mV respectively;
a bandbap voltage (which is also a reference voltage) vbg of 1200 mV;
but the present invention is not limited to this particular circuit, or to circuits for generating these particular reference voltages, and of course other reference circuits and/or reference signals can also be used.

Figure 3:
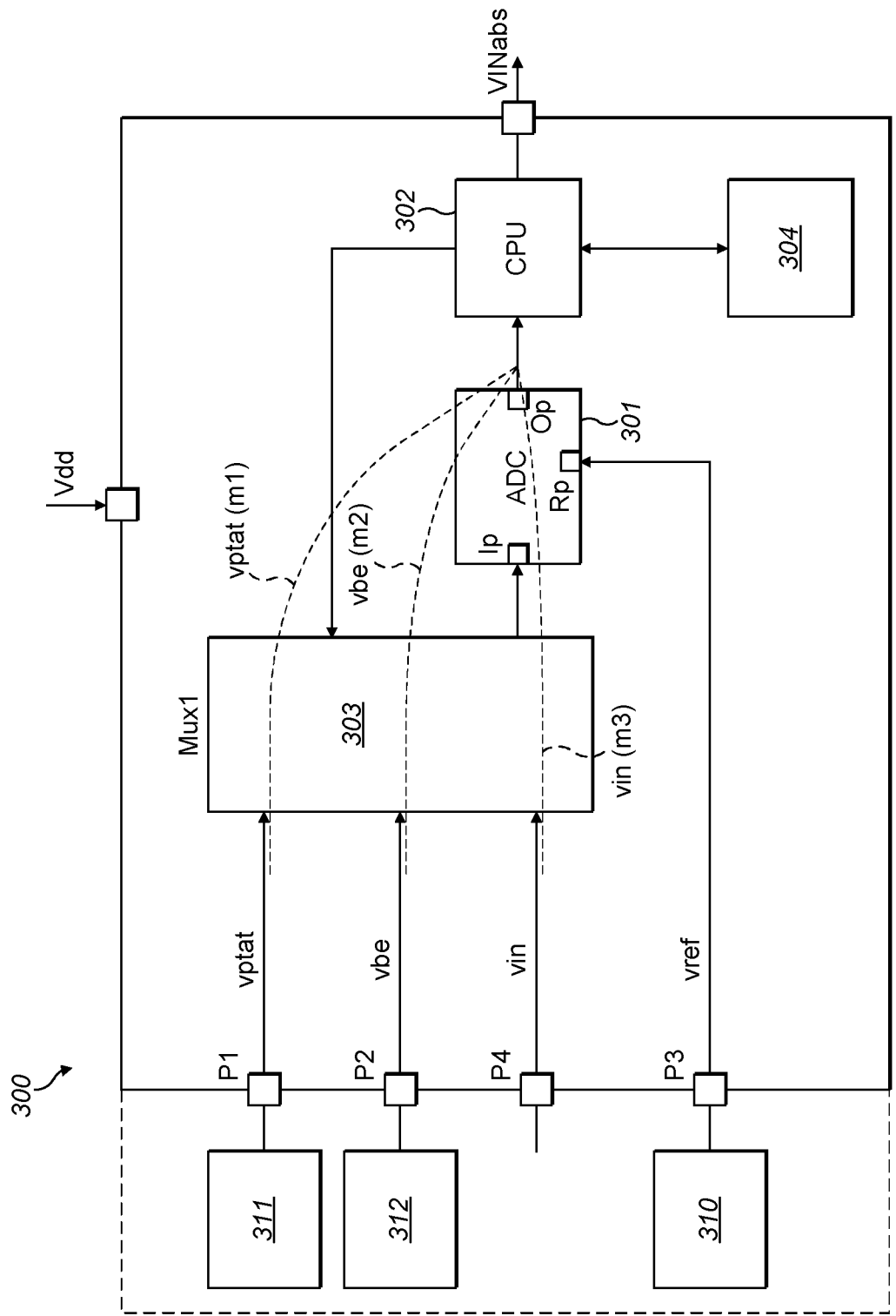
FIG. 3 is a block-diagram of a circuit according to an embodiment of the present invention having only a single ADC.

FIG. 3 is a block-diagram of a circuit 300 according to an embodiment of the present invention having only a single ADC 301. The circuit shown is a digitizer circuit, which may be a sub-circuit of a larger circuit, for example as part of a measurement device (see e.g. FIG. 8).

The circuit 311 for generating the first reference signal vptat, and the circuit 312 for generating the second reference signal vbe, and the circuit 310 for generating the reference voltage vref may be part of the (digitization) circuit 300, or may be located outside of the circuit 300 (as indicated by the dotted lines). While shown as separate blocks, in practice the circuits 311, 312 and 310 are preferably integrated on the same semiconductor substrate as the ADC (in which case the squares in the drawing are typically referred to as "nodes"), but they could also be provided on a second die packaged in the same chip (in which case the squares in the drawings are typically referred to as "ports").

The circuit 300 of FIG. 3 has a first port P1 (or node N1) for receiving the first reference signal vptat having a positive temperature coefficient, and a second port P2 (or node N2) for receiving the second reference signal vbe having a negative temperature coefficient.

The circuit 300 has a third port P3 (or node N3) for receiving the reference voltage vref, typically a bandgap voltage with a close-to-zero temperature coefficient in an envisioned temperature range (for example from about 20° C. to about 60° C.). In the embodiment of FIG. 3, the reference voltage vref is routed to the reference port Rp of the ADC via a direct connection, e.g. via a copper track, but another path with unity gain may also be used, for example through an analog multiplexer or through a buffer, or through a sample-and-hold circuit, or in any other suitable way.

The circuit 300 of FIG. 3 has a fourth port P4 (or node N4) for receiving an analog voltage signal "vin" that needs to be measured. This signal may come for example from a sensor unit (see e.g. FIG. 8), which may be part of the circuit 300, or may be external. In other words, the sensor unit may be located on the same die as the ADC 301 or may be located on another die but embedded in the same package or may be located outside of the chip containing the digitization circuit 300.

The circuit 300 further comprises a routing network for selectively routing one of the analog signals vptat, vbe and vin to the data input port "Ip" of the ADC 301. In FIG. 3 the routing network contains a single three-way multiplexer, but other routing networks may also be used, for example two two-way multiplexers connected in series (not shown), or three tri-state buffers (not shown) connected in parallel, having their inputs connected to the first, second and fourth port P1, P2, P4 respectively and having their outputs connected to input port of the ADC 301, or any other suitable routing network where the signal paths have unity gain.

The circuit 300 further comprises a computation unit or processing unit or processor 302, e.g. a programmable micro-controller adapted to configure the routing network, e.g. the multiplexer 303, and for obtaining digital values from the ADC via its output port Op. More specifically, the circuit 300 is adapted for performing three measurements: a) a first measurement in which vptat is routed to the input port of the ADC, and a first reference value VPTAT is obtained from the ADC; b) a second measurement in which vbe is routed to the input port of the ADC, and a second reference value VBE is obtained from the ADC; and c) a third measurement in which vin is routed to the input of the ADC, and a third digital value VIN is obtained from the ADC.

During each of these measurements, the same reference voltage vref is applied to the reference port of the ADC.

This can be schematically presented as follows
(m1), 1st measurement→VPTAT ~vptat/vref
(m2), 2nd measurement→VBE ~vbe/vref
(m3), 3rd measurement→VIN ~vin/vref
(where "~" means "is proportional to")
but of course these measurements may also be performed in a different order.

It was observed that:
i) each of VPTAT, VBE and VIN depends on the level of the analog reference voltage vref applied to the reference port of the ADC;
ii) however, it was surprisingly found that the formula VIN/(α·VPTAT+VBE), where a is a constant value, does not depend on the level of the analog reference voltage vref;
iii) it was surprisingly found that the digital value VR (referred to herein as "virtual reference value", and defined as:

$$VR = (\alpha \cdot VPTAT + VBE) \quad [3]$$

when calculated in the digital domain, only varies minimally with mechanical stress.

It is noted that the magnitude VR of this reference value varies with the level of the reference voltage applied to the ADC, but so does the value VIN taken by the same ADC, hence the level of the reference voltage cancels out if the mathematical formula is a ratio of two first order polynomials in VPTAT, VBE and VIN. This insight is one of the underlying principles of the present invention.

Figure 4:
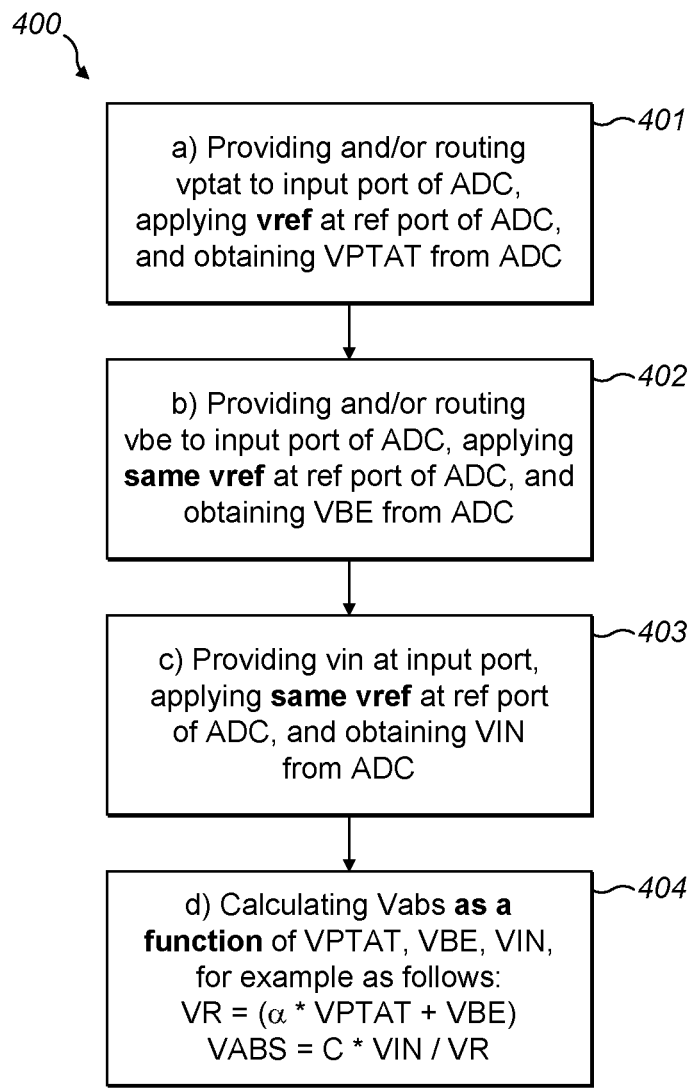
FIG. 4 shows a flow-chart illustrating a method of measuring the voltage signal of FIG. 3, according to an embodiment of the present invention.

Based on these observations, the present invention proposes the following formula to calculate the absolute voltage of the analog signal "vin", applicable to the circuit 300 of FIG. 4:

$$VABS[\text{in Volt}] = C \cdot VIN/(\alpha \cdot VPTAT + VBE) \quad [4]$$

where α is a constant, determined by design or by calibration, for example as the ratio of the negative temperature coefficient (of vbe) and the positive temperature coefficient (of vptat) under predefined conditions (e.g. at a predefined temperature). As is known in the art, it is an advantage of using this value for a because the positive and negative temperature dependence substantially compensate (within an envisioned predefined temperature range),
and where C is a constant, determined by design or by calibration, for example as the ratio of the actual reference voltage vref applied to the ADC, and the value of VR as calculated by the formula [3]. Stated in simple terms, the value for C converts the dimension-less "digital number" in the digital domain to an analog "voltage" level (e.g. expressed in Volt or milliVolt).

The value of α and C may be hardcoded (e.g. as part of a computer program that is executed by the CPU), or may be stored in a non-volatile memory 304 (e.g. NVRAM or flash or eprom or eeprom) embedded in or connected to the CPU during the calibration test, and retrieved by the CPU during actual use.

Tests have shown that the circuit and method described in FIG. 3 and FIG. 4 yield a digital value VABS [in Volt] which is at least 2 times, e.g. about 5 to 10 times less sensitive to mechanical stress than the digital value that would be obtained by the classical manner illustrated in FIG. 1 where the accuracy of the results deviates from the actual result if the analog bandgap voltage drifts due to mechanical stress.

In a variant of the circuit of FIG. 3, the circuit may further comprise a sample-and-hold block (not shown) arranged between the third port P3 (or node N3) and the reference port Rp of the ADC. In this embodiment, the controller 302 would configure the sample-and-hold block to sample a value of the reference voltage vref before performing the first measurement m1, and would maintain this voltage at its output during the three measurements m1, m2, m3 to guarantee that the same reference voltage vref is used during the three measurements. This embodiment may be even more robust against cross-talk and/or interference and/or supply disturbances, as long as they do not affect the output of the sample-and-hold block.

FIG. 4 shows a flow-chart illustrating a method 400 performed by the controller 302 for measuring the voltage signal "vin" in the circuit of FIG. 3, according to an embodiment of the present invention. The method 400 comprises the following steps:
 a) applying (e.g. providing and/or routing) 401 a first reference signal vptat having a positive temperature coefficient to the input port "ip" of the ADC 301, and applying (e.g. providing and/or routing) the reference voltage vref to the reference port Rp of the ADC, and obtaining a first digital reference value VPTAT from the ADC;
 b) applying (e.g. providing and/or routing) 402 a second reference signal vbe having a negative temperature coefficient to the input port "ip" of the ADC, and applying (e.g. providing and/or routing) the same reference voltage vref as was used in step a), (meaning a reference voltage vref having substantially the same voltage level) to the reference port "Rp" of the ADC, and obtaining a second digital reference value VBE from the ADC;
 c) applying (e.g. providing and/or routing) 403 the analog signal to be measured (e.g. sensor signal) "vin" to the input port "ip" of the ADC, and applying (e.g. providing and/or routing) the same reference voltage vref as was used in step a) and step b), (meaning a reference voltage vref having substantially the same voltage level) to the reference port "Rp" of the ADC, and obtaining a raw digital signal value VIN from the ADC;
 d) calculating 404 the absolute voltage level VABS of the analog signal "vin" in the digital domain as a mathematical function of the first digital reference value VPTAT, and the second digital reference value VBE, and the raw digital signal value VIN, and one or more constants.

More specifically, for the block-diagram of FIG. 3, step d) may be performed using the following formula or an equivalent formula:

$$Vabs[\text{in Volt}] = C \cdot VIN/(\alpha \cdot VPTAT + VBE) \quad [5]$$

As mentioned above, each of VIN, VPTAT and VBE are inversely proportional to Vref, but the end result of formula [5] is highly independent of the actual reference voltage vref applied to the ADC, because formula [5] is a ratio of two first order polynomials, where each term is inversely proportional to vref. Instead, the accuracy relied upon is that of the vptat and the vbe voltages, and their opposite temperature and/or stress dependence (within an envisioned temperature range), and the accuracy of the multiplication and addition in the digital domain. Evidently the tolerance of the result depends on the resolution (number of bits) of the ADC, but the skilled person can choose a suitable resolution dependent on the application, for example to be 10 bit or 12 bit or 14 bit or 16 bit or 18 bit or 20 bit. The expression "using substantially the same reference voltage" is to be interpreted as "within a tolerance margin corresponding to 1 LSB". The main advantage is that the multiplication and summation occur in the digital domain, and therefore do not suffer from gain error and offset error, because such calculations are error-free.

Figure 5:
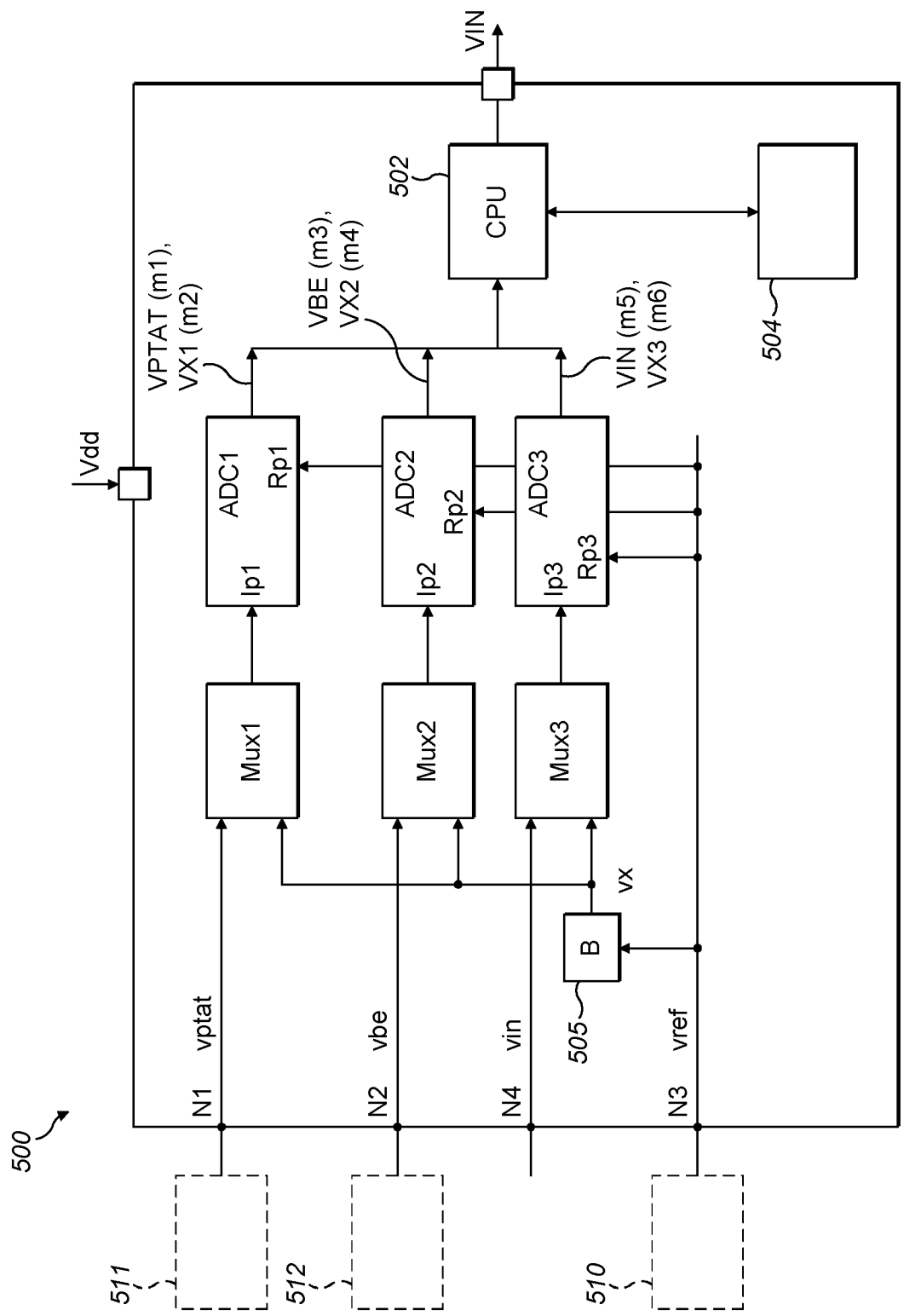
FIG. 5 is a block-diagram of a circuit according to another embodiment of the present invention having three ADCs.

FIG. 5 is a block-diagram of a circuit 500 according to another embodiment of the present invention having three ADCs, which can be seen as a variant of the circuit 300 of FIG. 3. In practice ADC1 has a first gain G1, and ADC2 has a second gain G2, and ADC3 has a third gain G3, which are always at least slightly different from each other, and may individually drift over time, in particular due to local differences of mechanical stress. The main principles as described above can also be used for this circuit 500, but a few additional measurements need to be performed, and a different formula is to be used.

More specifically, the circuit 500 of FIG. 5 comprises a first A/D convertor ADC1 with a first gain G1 and a second A/D convertor ADC2 with a second gain G2, and a third A/D convertor ADC3 with a third gain G3, each ADC having a reference port rp1, rp2, rp3 adapted for receiving the same reference voltage vref, which is preferably a bandgap voltage. Even if the layout of the three ADC's is the same, and even if the components of the three ADC's are matched, each ADC has its own gain G1, G2, G3, which may be determined during calibration, but may drift over time, due to ageing, temperature and/or humidity and/or mechanical stress variations (e.g. due to packaging and/or soldering). Thus, the exact values of G1, G2, G3 during actual use of the device are unknown (or not exactly known), and yet the circuit is to be used for very precise measurement, with a reduced sensitivity to mechanical stress variations.

Thereto, the circuit 500 is further adapted for providing a second stable reference signal vx, having a voltage level smaller than each of (vref/G1) and (vref/G2) and (vref/G3). In the exemplary circuit 500, the second stable reference voltage vx is provided by an attenuator circuit 505 adapted for attenuating the reference voltage vref. The exact value of the attenuation B is not important, and it may even slowly drift over time, but for similar reasons as explained above for vref, it is important that vx is "the same vx" during the measurements of this vx signal through each of the ADCs, described below. Although not absolutely necessary, a second sample-and-hold circuit (not shown) may be added to the circuit 500, at the output of the attenuator 505, for sampling and holding the momentary value of vx before entering the multiplexers mux1, mux2, mux3.

The circuit 500 further comprises a routing network adapted for:
a) selectively routing (e.g. via mux1) one of the first reference signal vptat and the attenuated signal vx to the input port Ip1 of the first A/D convertor ADC1, and for
b) selectively routing (e.g. via mux2) one of the second reference signal vbe and the attenuated signal vx to the input port Ip2 of the second A/D convertor ADC2, and for
c) selectively routing (e.g. via mux3) one of the analog voltage signal vin to be digitized and the attenuated signal vx to the input port Ip3 of the third A/D convertor ADC3.

The controller 502 is adapted for obtaining the first reference value VPTAT (during step a) and the second reference value VBE (during step b) and the raw input value VIN (during step c), and is further adapted for:
e) configuring the routing network (e.g. mux1) to route the attenuated signal vx to the input port ip1 of the first ADC, and obtaining a first (digital) attenuation value VX1, while applying the same reference voltage vref as was used in step a) to step c) to the reference port Rp1 of the first ADC;
f) configuring the routing network (e.g. mux2) to route the attenuated signal vx to the input port ip2 of the second ADC, and obtaining a second (digital) attenuation value VX2, while applying the same reference voltage vref as used in step a) to step c) to the reference port Rp2 of the second ADC;
g) configuring the routing network (e.g. mux3) to route the attenuated signal vx to the input port ip3 of the third ADC, and for obtaining a third (digital) attenuation value VX3 while applying the same reference voltage vref as used in step a) to step c) to the reference port Rp3 of the third ADC.

The controller 502 is adapted for performing the calculation of step d) after the six values VPTAT, VX1, VBE, VX2, VIN, VX3 are obtained, and the absolute voltage VABS of the input signal vin can be calculated in the digital domain, as a function of these six values, more in particular as an algebraic function using only multiplications, summations (or subtractions) and divisions.

In the specific example of the circuit shown in FIG. 5, step d) may comprise calculating the digital value VABS for the analog signal vin to be digitized using the following formula or an equivalent formula:

$$VABS=C*(VIN/VX3)/[\alpha*(VPTAT/VX1)+(VBE/VX2)] \quad [6]$$

wherein VABS is a digital representation of the absolute voltage of the analog signal vin to be digitized, wherein VPTAT is the first digital reference value and VX1 is the first attenuation value measured by the first ADC, VBE is the second digital reference value and VX2 is the second attenuation value measured by the second ADC, and VIN is the raw digital signal value and VX3 is the third attenuation value measured by the third ADC, and $\alpha$ and C are predetermined constants which may be defined during a calibration test, and may be stored in a non-volatile memory 504, which may be embedded in, or connected to the CPU 502.

Thus, according to an embodiment of the present invention, the absolute voltage level of an analog voltage vin can be determined using the circuit of FIG. 5, and a method in which six measurements are performed:
(m1), 1st measurement (of vptat)→VPTAT ~G1*vptat
(m2), 2nd measurement (of vx)→VX1 ~G1*vx
(m3), 3rd measurement (of vbe)→VBE ~G2*vbe
(m4), 4rd measurement (of vx)→VX2 ~G2*vx
(m5), 5th measurement (of vin)→VIN ~G3*vin
(m6), 6th measurement (of vx)→VX3 ~G3*vx
and to determine the absolute voltage level VABS of the input signal vin to be measured using formula [6] or an equivalent formula. Of course, the order of these measurements can be changed.

It is noted that the gain factors G1, G2, G3 need not be measured during a calibration test, and may even drift over time, as long as they are substantially constant (within a predefined tolerance margin of 1 LSB) during the respective measurements. Or stated in other words: G1 must be substantially constant during measurement m1 and m2, G2 must be substantially constant during measurement m3 and m4, and G3 must be substantially constant during measurement m5 and m6, but the values of G1, G2 and G3 can be quite different from each other. For optimal results, the value of $\alpha$ and C are preferably determined during calibration, and stored in a non-volatile memory.

It is an advantage of this method that the absolute voltage level VABS so calculated is substantially independent on the values of the attenuation B, the gain factors G1, G2, G3, the reference voltage vref, and has a reduced sensitivity to mechanical stress.

In a variant of the circuit 300 of FIG. 3 having a single ADC, and the circuit 500 of FIG. 5 having three ADC's, it is of course also possible to use a circuit (not shown) having only two ADC's. The skilled person having the benefit of the present disclosure can easily arrive at a suitable block-diagram and a suitable formula, for example by omitting MUX2 and ADC2 in FIG. 5, replacing MUX 1 by a 3-way multiplexer to selectively route one of vptat, vx, and vbe to the input port of the ADC1, by setting VX2 equal to VX1 in formula [6], and by omitting the 4th measurement.

The reference blocks 511, 512 and 510 may be the same reference blocks as were used in FIG. 3 or other reference blocks. Similar as in FIG. 3, the reference blocks 511, 512 and 510 may be part of the circuit 500, or may be provided by external circuitry, for example from a second die embedded in the same package. The same applies to the other circuits described in this document.

Figure 6:
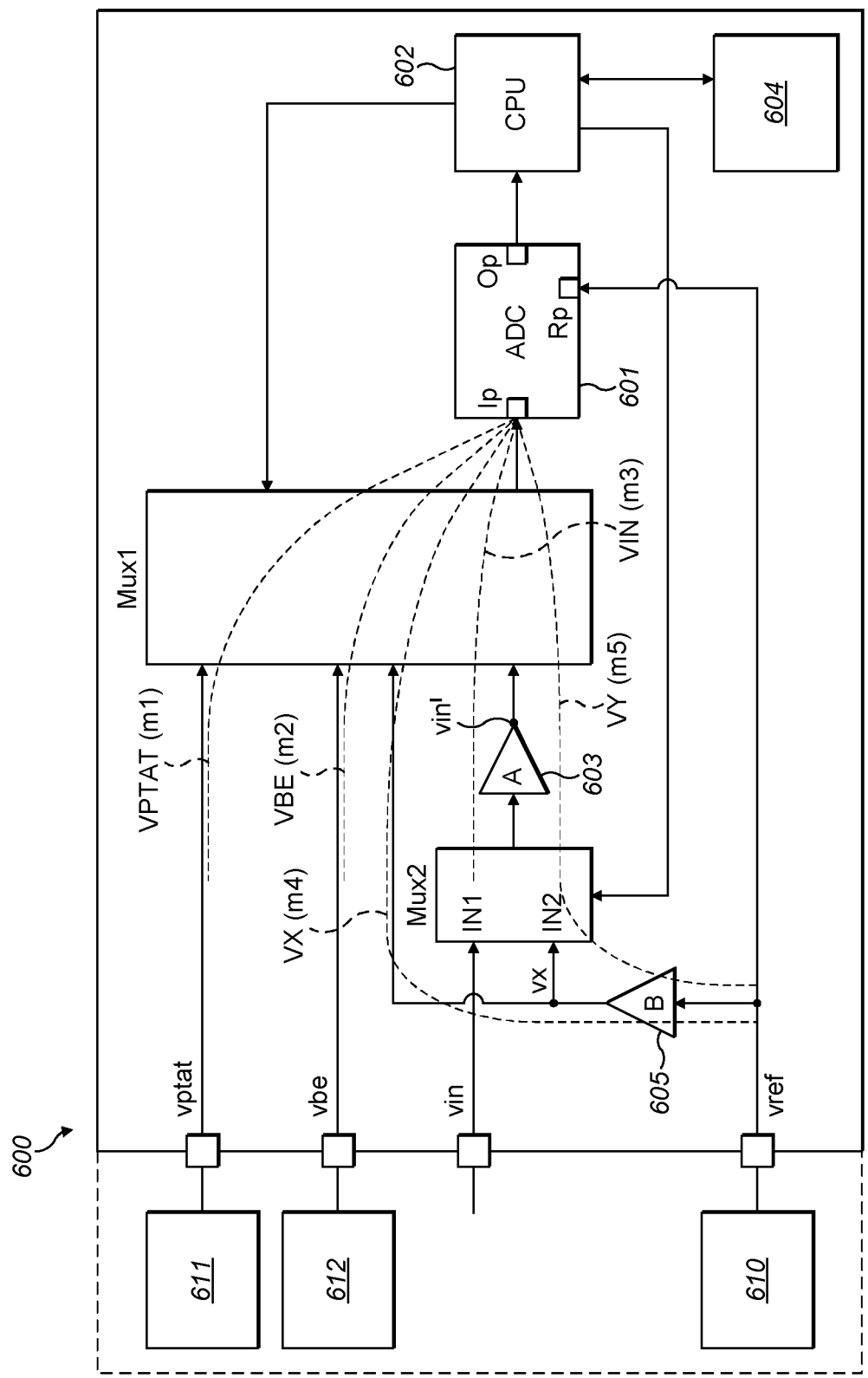
FIG. 6 is a block-diagram of a circuit according to another embodiment of the present invention having a single ADC and an amplifier for amplifying the analog signal to be measured before digitizing.

FIG. 6 is a block-diagram of another circuit 600 according to an embodiment of the present invention having a single ADC 601 and an analog amplifier 603. This circuit is ideally suited for digitizing a relatively small analog signal. The idea of the circuit 600 is to first amplify the input signal in the analog domain before digitizing, in order to reduce the quantization error. While the mere idea to first amplify the analog signal vin with a predefined gain (for example by a factor of exactly 100.000), and then divide the digital value with that same factor in the digital domain may sound easy in theory, in practice it is not easy to make an amplifier with a precise gain, which does not drift over time, and/or humidity and/or temperature changes and/or due to mechanical stress, and preferably all at the same time.

Thus, the problem underlying the circuit of FIG. 6 can be formulated that the absolute voltage level of "vin" needs to be determined with high accuracy (e.g. with a reduced quantization error), and with a reduced sensitivity to mechanical stress. The solution involves amplification before digitization, however, as mentioned above, each analog amplifier has a gain error and an offset error, which may moreover change over time due to mechanical stress, and thus adding an amplifier may increase the sensitivity to mechanical stress rather than decreasing it.

Starting from the circuit of FIG. 1, the inventors had to overcome a first "common believe" that in order to obtain a very precise digital measurement, a very precise and stable reference voltage must be applied to the ADC, and had to overcome a second "common believe" that in order to obtain a very precise digital measurement which is amplified before digitization, a very precise and stable amplifier must be used, with a gain which is exactly known.

But the inventors found a way to overcome both "common beliefs" by using the circuit of FIG. 6 and by performing the following five measurements:

(m1), 1st measurement (of vptat, directly)→VPTAT ~vptat
(m2), 2nd measurement (of vbe, directly)→VBE ~vbe
(m3), 3rd measurement (of vin, via amplifier A)→VIN ~A.vin
(m4), 4rd measurement (of vref via attenuator B)→VX ~B.vref
(m5), 5th measurement (of vref via A & B)→VY ~A.B.vref with "directly" is meant "via a path with unity gain". and to calculate the absolute voltage of the analog input signal "vin" to be measured, using a mathematical function of the five digital values so obtained, namely VPTAT, VBE, VIN, VX, VY, all measured using a single ADC, while applying the same reference voltage vref to the reference port Rp of the ADC. With "the same" is meant for example within a tolerance margin of 1 LSB.

For the circuit and method illustrated in FIG. 6, the following formula is proposed:

$$VABS = C^* VIN^* (VX/VY)/(\alpha \cdot VPTAT + VBE) \quad [7]$$

wherein VABS is a digital representation of the absolute voltage of the analog signal vin to be digitized, VPTAT is the first digital reference value obtained when measuring the first reference signal vptat, VBE is the second digital reference value obtained when measuring the second reference signal vbe, VIN is the raw digital signal value measured through the amplifier A, VX is a digital representation of the attenuated reference voltage vref (through attenuator B), and VY is a digital representation of the attenuated and amplified reference voltage vref (through attenuator B and through amplifier A), and $\alpha$ and C are predetermined constants which may be defined during a calibration test, and may be stored in a non-volatile memory 604, which may be embedded in, or connected to the CPU 602.

As can be appreciated from formula [7] the level of the reference voltage "vref", and the attenuation "B" of the attenuator 605, and the gain "A" of the amplifier 603 all cancel out, and therefore need not be known, and may drift over time, as long as the voltage level vref, and the value of A and B is substantially constant during the five measurements, e.g. is constant within a tolerance margin corresponding to 1 LSB of the ADC.

It is an advantage of this circuit and method that the absolute voltage level VABS so calculated is substantially independent on the actual value of the attenuation B, and the actual value of the gain A, and the actual level of the reference voltage vref, and thus has a reduced sensitivity to mechanical stress, inter alia because each of these values may independently drift, and because the multiplication by a and the summation with VBE is performed in the digital domain.

From the examples given above, it can be understood that the principles and advantages of the present invention are applicable to circuits and methods for which the absolute voltage VABS can be calculated as a ratio of two first order polynomials which can be expressed by the following general formula:

$$VABS = (C^* VIN/V1)/[(\alpha^* VPTAT/V2) + (VBE/V3)] \quad [8]$$

where VPTAT, VIN, VBE have the same meaning as described above, $\alpha$ and C are predefined constants, for example determined during calibration, and V1, V2, V3 are digital values obtained by measurement using a single ADC.

Figure 7:
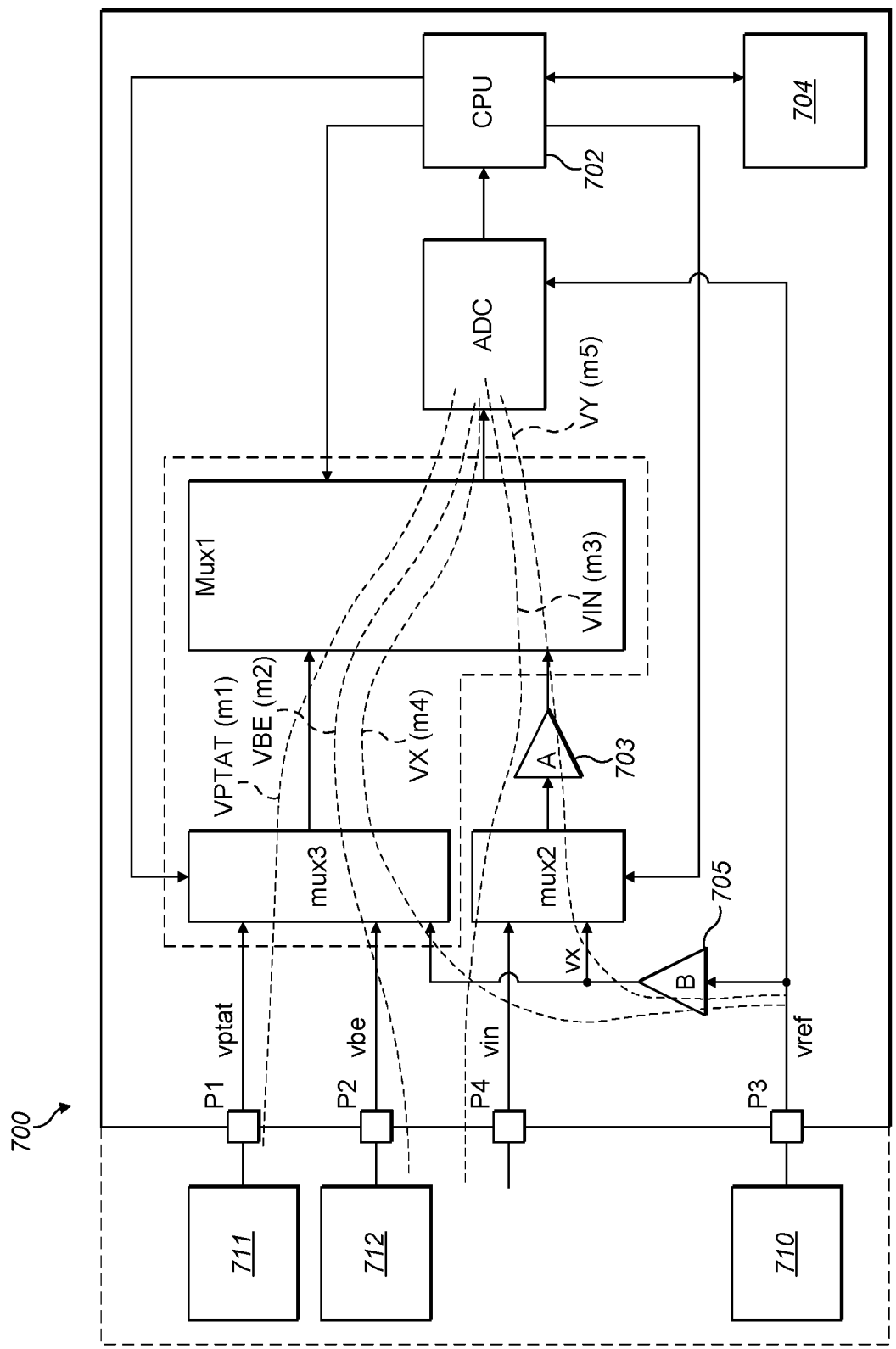
FIG. 7 is a block-diagram of a circuit according to another embodiment of the present invention, which can be seen as a variant of the block-diagram of FIG. 6.

FIG. 7 is a block-diagram of a circuit 700 according to an embodiment of the present invention, which can be seen as a variant of the block-diagram of FIG. 6. As can be seen, the main difference is that in the circuit 600 of FIG. 6 the multiplexer mux1 is a 4-input multiplexer, whereas in the circuit 700 of FIG. 7 the multiplexer mux1 is replaced by two multiplexers connected in series: a three-input multiplexer mux3 followed by a two-input multiplexer mux1.

If each of the analog paths from the first port or node P1 to the input port of the ADC, and from the second port or node P2 to the input port of the ADC, and from the fourth port or node P4 to the input port of the ADC, through the multiplexer mux3 and through the multiplexer mux1 have unity gain, the same formula [7] is also applicable for the circuit of FIG. 7, but of course other variants of the circuit 600 and 700 are also possible.

For example, in a variant of the circuit shown in FIG. 7, one or two sample-and-hold circuits (not shown) may be added to the circuit of FIG. 7, for example the first for sampling and holding the reference voltage vref, and the second for sampling and holding the signal vx, but that is not absolutely required. The skilled person having the benefit of the present disclosure can easily think of other circuits and methods according to the same principles as explained above.

Figure 8:
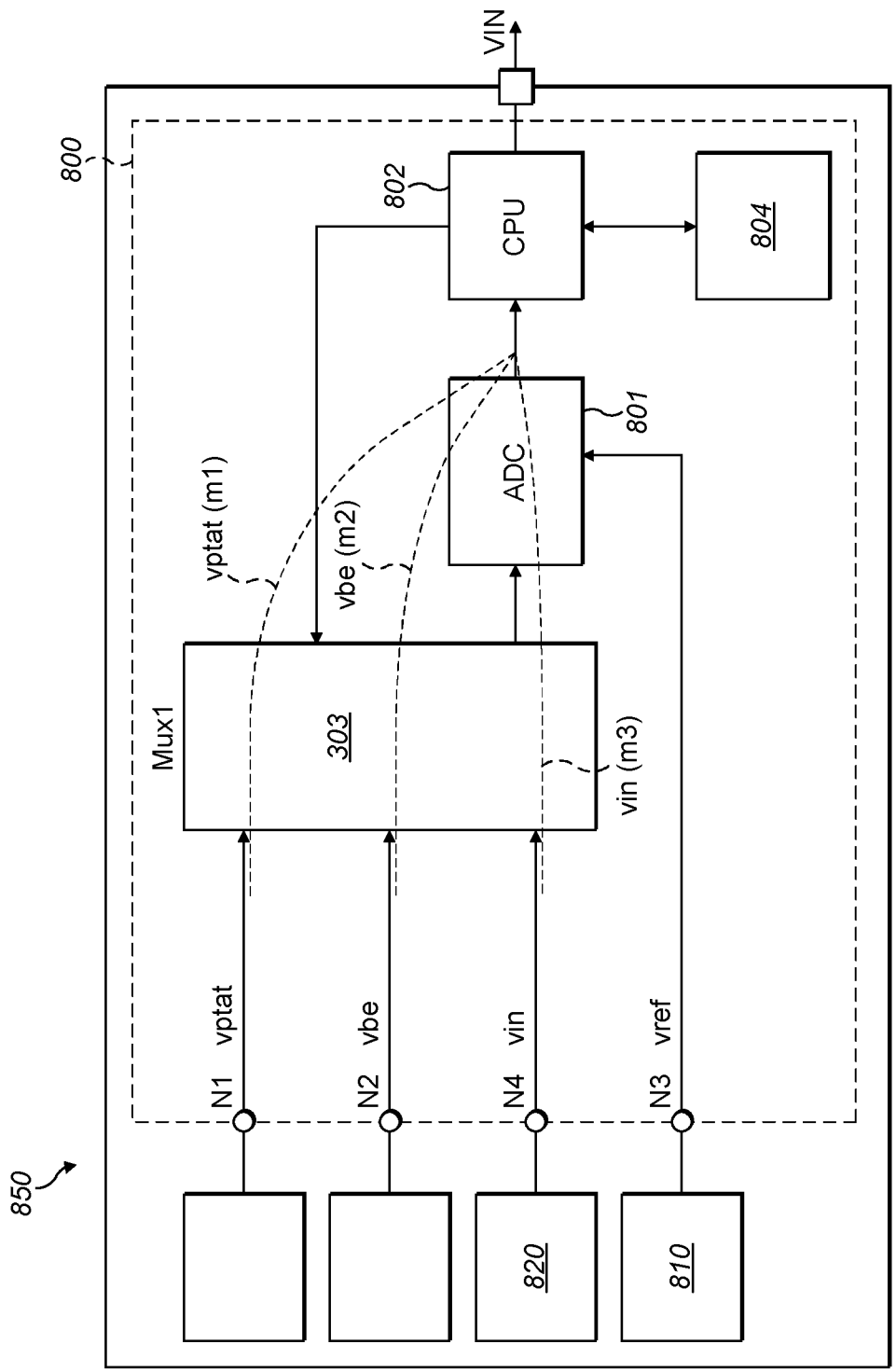
FIG. 8 is a block-diagram of a device according to an embodiment of the present invention, comprising a circuit according to embodiments of the present invention, e.g. the circuit of FIG. 3, and further comprising a sensor circuit.
Figure 9A:
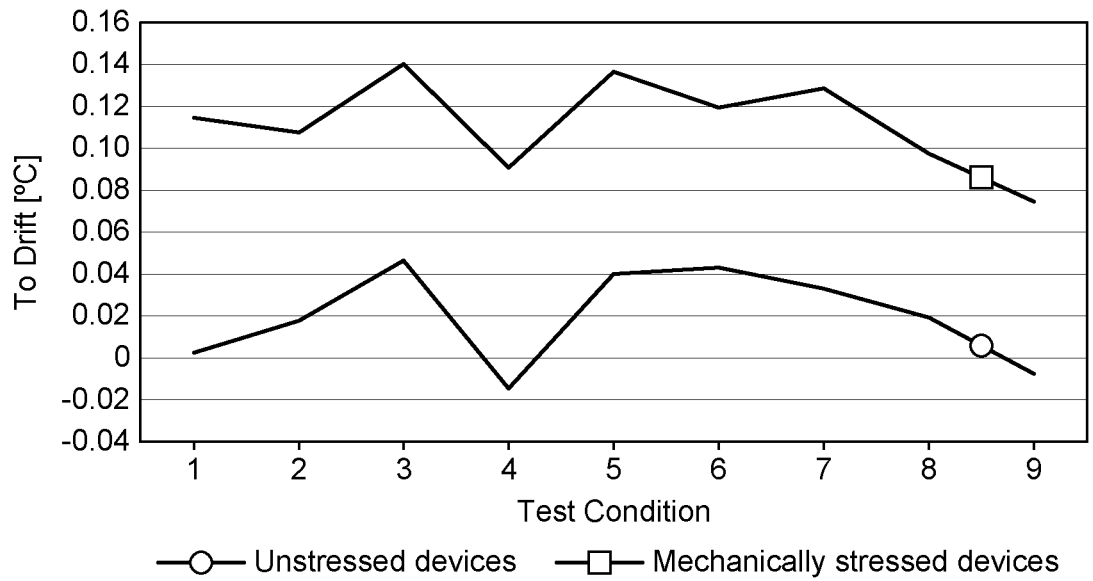
FIGS. 9(a) to 9(d) show evaluation results of a number of prototype devices.
Figure 9B:
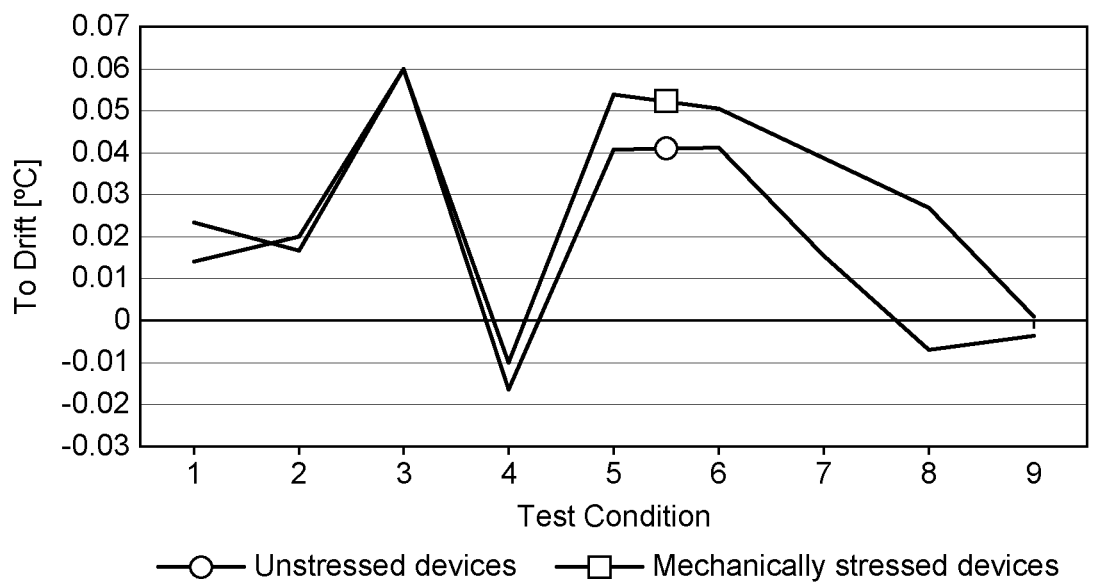
Figure 9C:
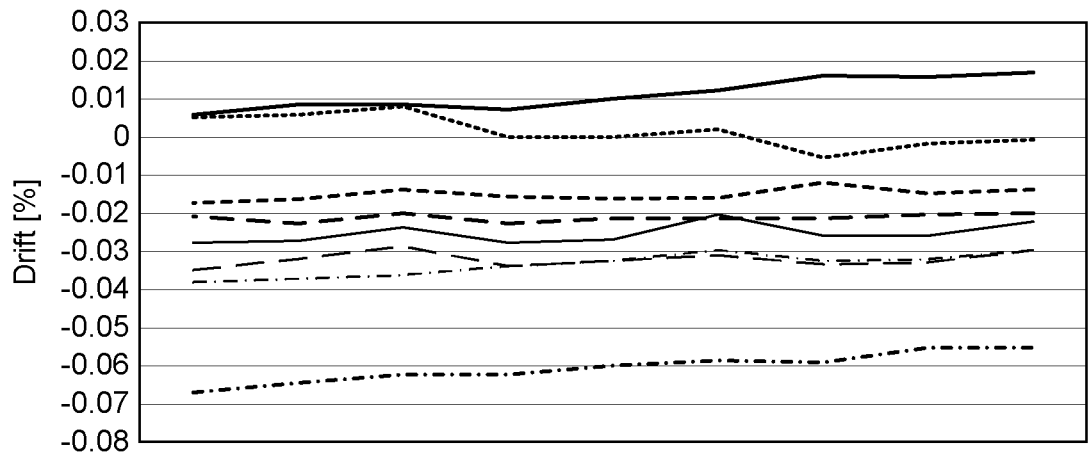
Figure 9D:
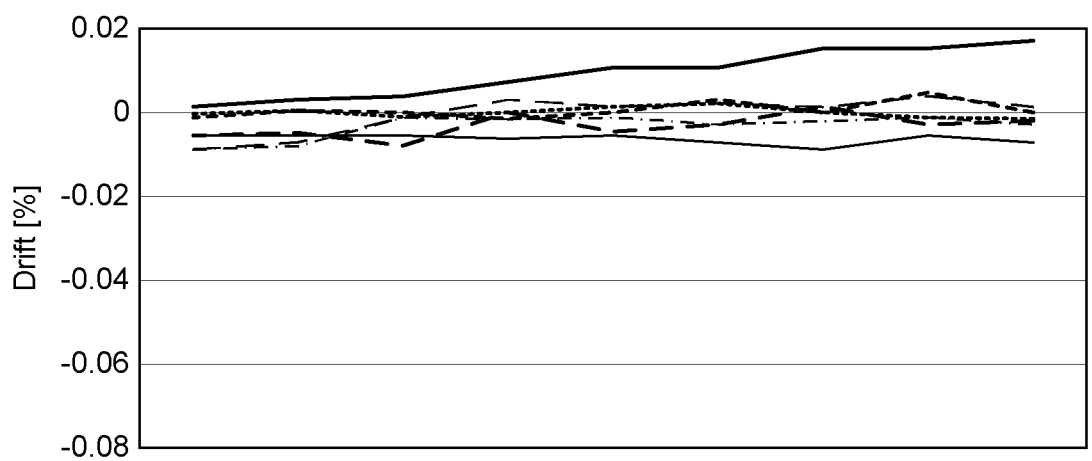
Figure 10A:
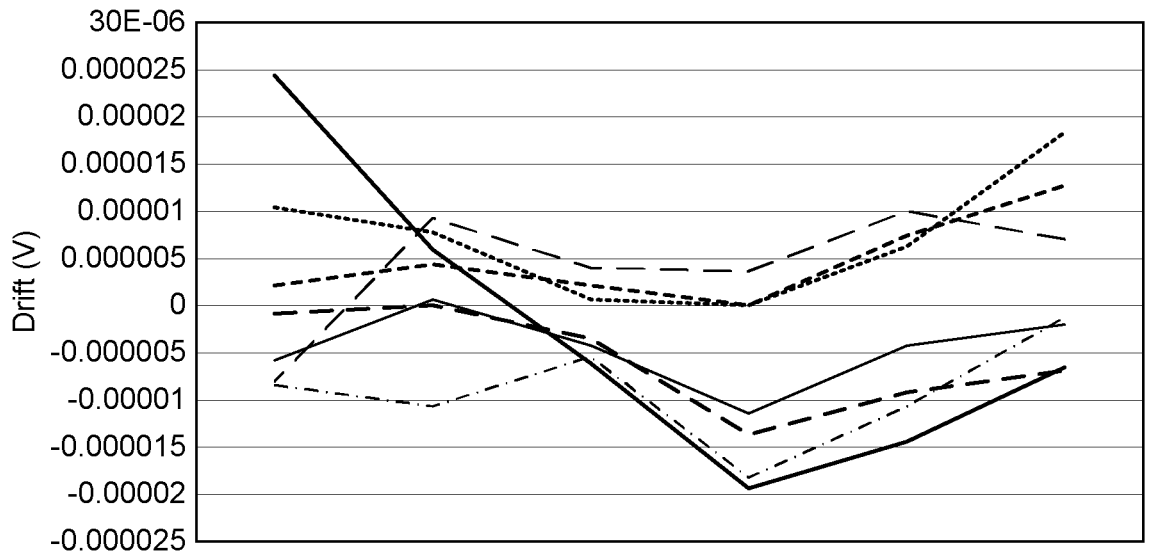
FIG. 10(a) illustrates the drift of the analog vptat reference signal, under mechanical stress.
Figure 10B:
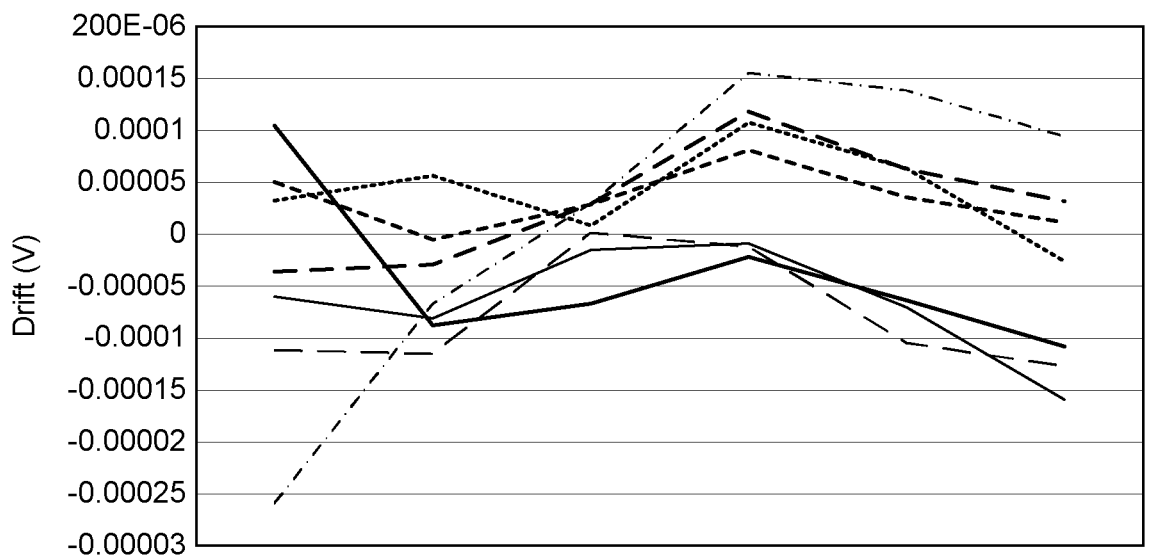
FIG. 10(b) illustrates the drift of the analog vbe reference signal, under mechanical stress.
Figure 10C:
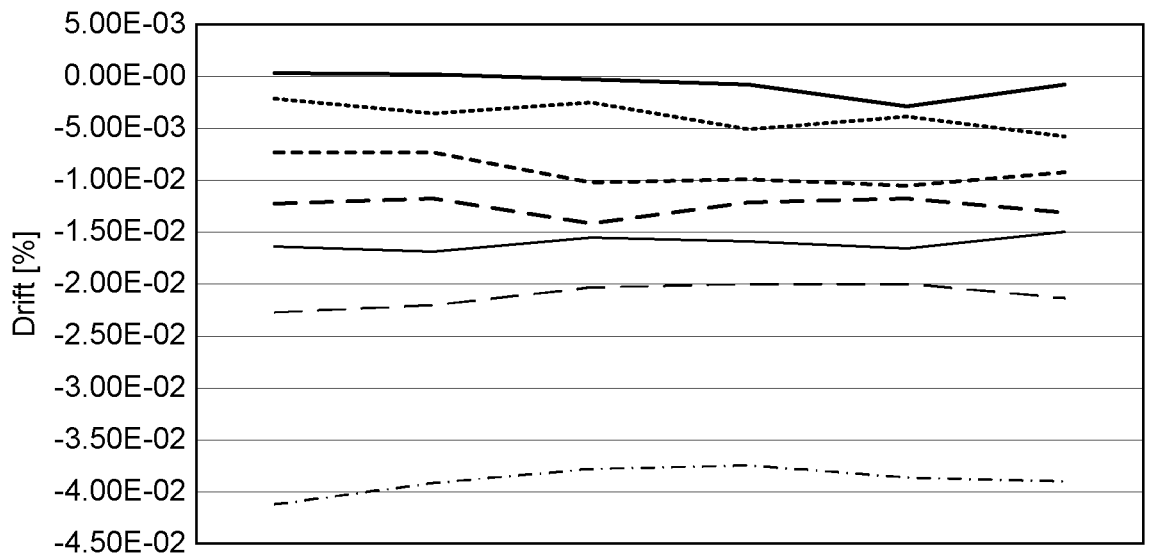
FIG. 10(c) shows % drift of the analog reference voltage generated by the circuit of FIG. 8 measured in a circulation bath.
Figure 10D:
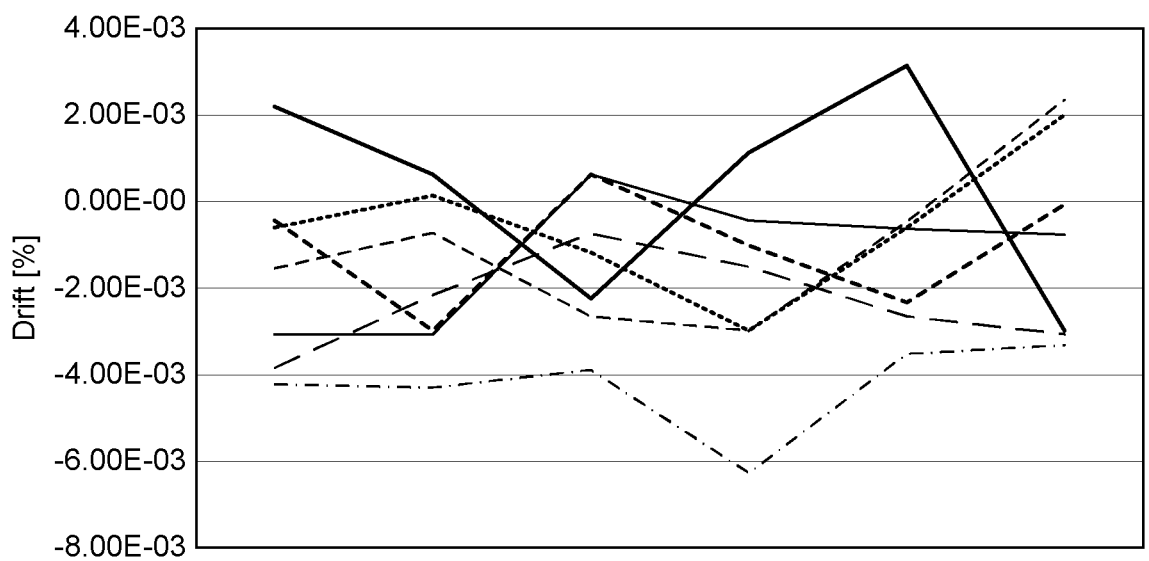
FIG. 10(d) shows % drift of the virtual reference VR, measured in the circulation bath.

FIG. 8 is a block-diagram of a device 800 according to an embodiment of the present invention, comprising the circuit 300 of FIG. 3, and further comprising a sensor circuit 820. The circuit 800 may be part of an integrated semiconductor device.

The device 800 may for example be a measurement device for measuring an absolute pressure, or for measuring an absolute temperature, or for measuring radiation, e.g. for measuring infrared radiation (IR), or for measuring a magnetic field strength, or for measuring a current, etc. The device 800 may be a portable or handheld measurement device, for example a digital voltmeter, a portable thermometer, etc.

While not shown, the device 800 may further comprise a display unit, e.g. an LCD display, and the controller 802 may be further adapted for driving the display or configuring the display or sending information to the display for generating a visible representation of the digital value (Vabs) or the physical value it represents, e.g. pressure or temperature or voltage or current or radiation or magnetic field strength, etc.

While the device of FIG. 8 is only shown with the digitization circuit of FIG. 3 (having a single ADC and a single multiplexer), the circuit of FIG. 5 (with three two-way multiplexers and three ADC's) or FIG. 6 (with two multiplexers and a single ADC) or FIG. 7 (with a single ADC, two multiplexers, an attenuator and an amplifier), or variants thereof can also be used.

FIGS. 9(*a*) to 9(*d*) show evaluation results of a number of prototype devices having a circuit 800 as shown in FIG. 8, implemented on a single CMOS die, after packaging in a plastic package. The sensor circuit 820 of these prototype devices is a temperature sensor, hence the absolute voltage measured is translated into a temperature readout, but the invention is not limited thereto, and other devices can also be used.

Eight devices (for performing an absolute temperature measurement) were used in order to investigate the effect of mechanical stress (e.g. due to a soldering process) on the temperature measurements performed by the device.

The eight devices were first measured at 9 test conditions corresponding to all possible combinations of ambient temperatures and object temperatures where the ambient temperature can be 25° C., 45° C. or 55° C. and the object can be 20° C., 40° C. or 60° C. These first measurements were used to calibrate the devices. The devices were also measured in a circulation bath.

Two devices were used as "reference devices" (these devices were not mechanically stressed) while the other 6 devices were mechanically stressed by a short exposure to a high temperature similar to a typical soldering temperature. After the mechanical stress, all devices were measured again, and drifts were analysed. The object temperature was calculated based on the calibration parameters that were computed during the first measurement, before the mechanical stress. The devices were also measured in the circulation bath in order to identify drifts of the signals vref, vbe, vptat and the virtual reference VR.

FIG. 9(*a*) shows the measurement error (in casu: object temperature error) when using the classical ADC measurement approach (explained in FIG. 1) which relies on the accuracy of the analog reference voltage vref. As can be seen, the devices that were mechanically stressed (curve with squares) show a larger average error than the devices that were not mechanically stressed (curve with circles).

FIG. 9(*b*) shows the measurement error (in casu: object temperature error) when using a method according to the present invention, based on the "virtual reference" explained above (see e.g. FIG. 3 and FIG. 4). As can be seen, the devices that were mechanically stressed (curve with squares) show approximately the same average error as devices that were not mechanically stressed (curve with circles), demonstrating that a method according to the present invention is less sensitive to mechanical stress variations.

FIG. 9(*c*) shows the drifts of the analog reference signal vref, generated by the reference block 810 having a schematic shown in FIG. 2 over the 9 measurements. This voltage level was measured using an external analog voltmeter.

FIG. 9(*d*) shows the drift of the virtual reference VR calculated according to formula [3] above, where VPTAT and VBE were measured by the internal ADC and the absolute voltage Vabs was computed using formula [4]. Comparison of FIG. 9(*d*) and FIG. 9(*c*) shows that the drift of the virtual reference VR is (on average) smaller than the drift of the analog reference voltage vref.

FIG. 10(*a*) shows drift of the first analog reference signal vptat, measured in the circulation bath, and FIG. 10(*b*) shows drift of the second analog reference signal vbe, measured in the circulation bath.

FIG. 10(*c*) shows the measurements of the reference voltage vref in the circulation bath, and FIG. 10(*d*) shows measurements of the virtual reference VR in the circulation bath.

The X axis in FIG. 10(*a*) to FIG. 10(*d*) shows the temperature of the chip, from 30° C. to 80° C.

As can be seen, the variations on the analog signal vptat and vbe are very small. The maximum deviation of vptat is +25 µV which corresponds to +0.13° C. error on the output, and the maximum deviation of vbe is −250 µV also corresponding to 0.13° C.

The reference voltage vref generated in the unstressed devices, when measured in the circulation bath drifted less than 0.005% (or 50 ppm). The reference voltage vref generated in the mechanically stressed devices generate a reference voltage vref having a drift between −0.007% and −0.04% (or between −70 ppm and −400 ppm). The drift of the virtual reference VR is between 0.003% and −0.006% (or between +30 ppm and −60 ppm), which is at least a factor of about 2 improvement.

FIG. 11(*a*) to FIG. 11(*d*) shows an experiment of mechanical stress caused by a vise (or stress bench). During the test, a device was placed on the stress bench in 3 different directions and a mechanical force was applied to the device up to 100N. The analog signals vref, vptat and vbe were measured. The virtual reference VR is computed based on the measurements of VBE and VPTAT corresponding to vbe and vptat, as described above.

The X axis in FIGS. 11(*a*) to 11(*d*) show the for applied to the package in Newton.

FIG. 11(*a*) shows % drift of three exemplary bandgap voltages vref1, vref2, vref3 as can be generated by the exemplary circuit of FIG. 2 versus pressure exerted on the device in a first direction (X-direction), parallel to the plane of the substrate.

Figure 11A:
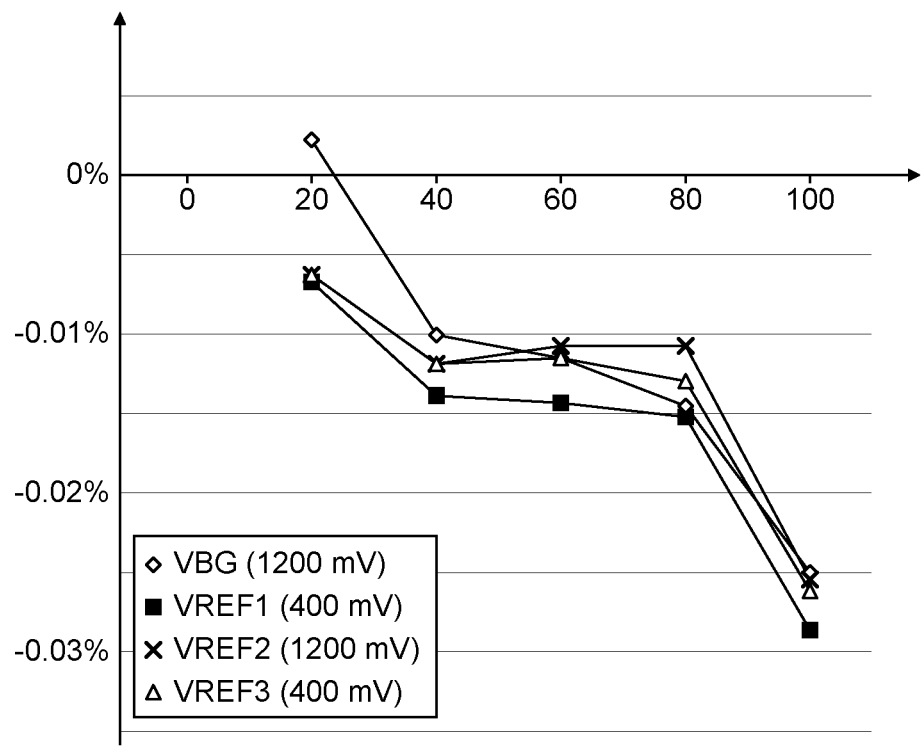
FIGS. 11(a) to 11(d) illustrate experiments where mechanical stress was caused by a vise (or stress bench) on the device.
Figure 11B:
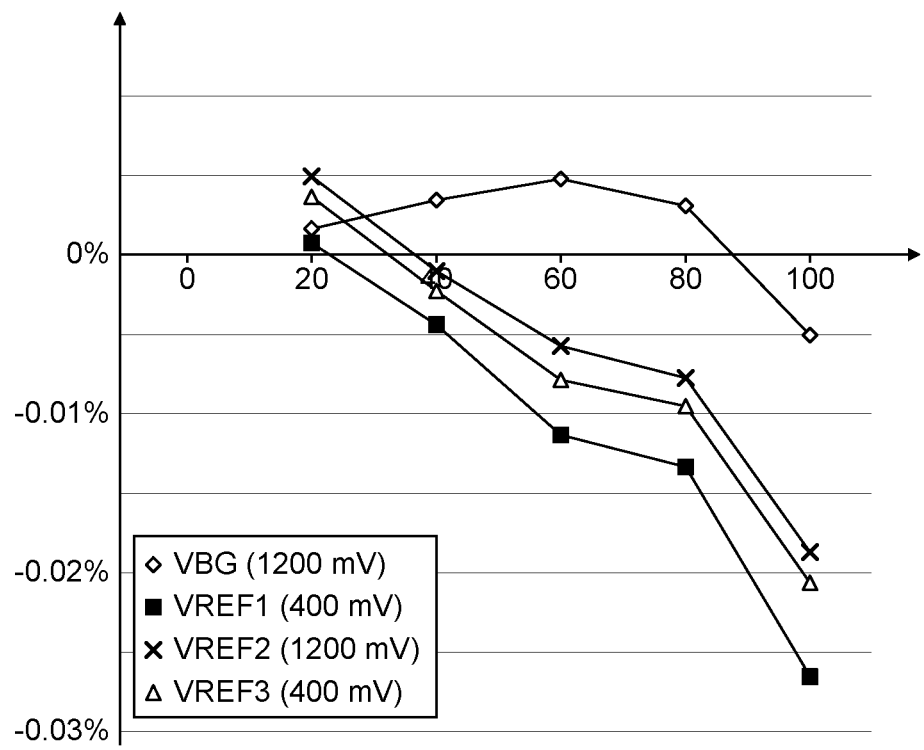

FIG. 11(b) shows % drift of three exemplary bandgap voltages vref1, vref2, vref3 as can be generated by the exemplary circuit of FIG. 2 versus pressure exerted on the device in a second direction (Z-direction) perpendicular to the plane of the substrate.

Figure 11C:
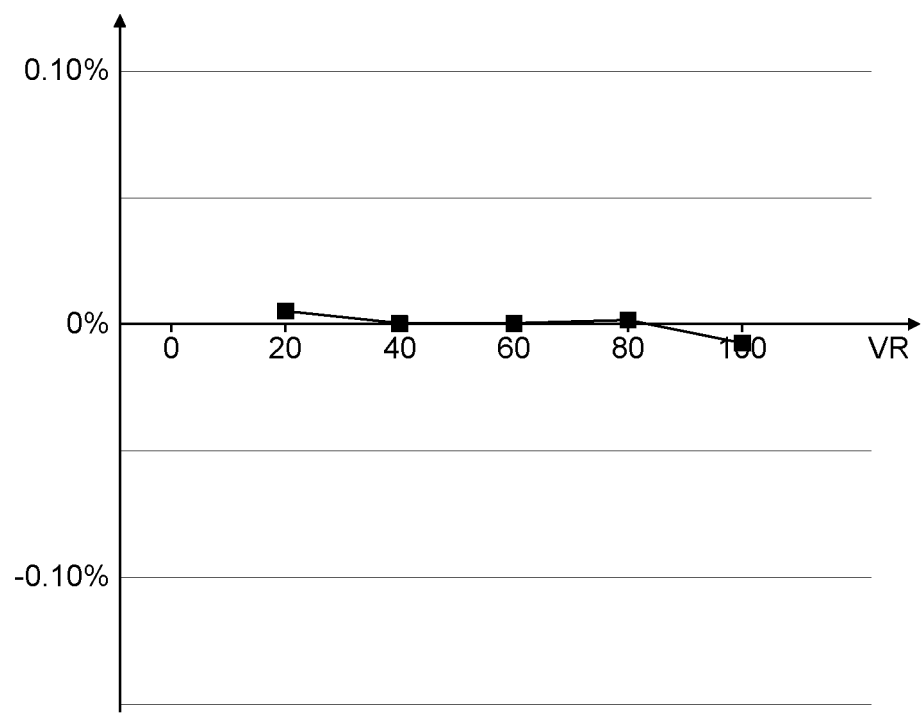

FIG. 11(c) shows % drift of the virtual reference value VR versus pressure exerted on the device in the first direction (X-direction).

Figure 11D:
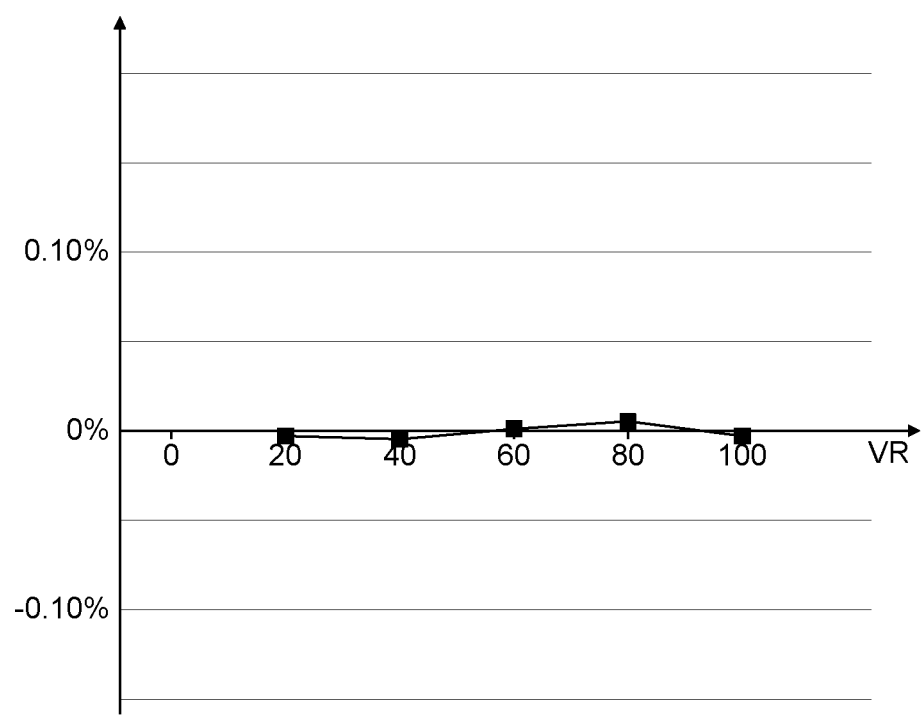

FIG. 11(d) shows % drift of the virtual reference value VR versus pressure exerted on the device in the second direction (Z-direction).

It was found that the analog reference voltage vref drifts down with −0.035% (−350 ppm) if a mechanical pressure force of 100N was applied, but as can be seen, the virtual reference VR (using formula [3]) remains substantially flat, and does not significantly change with the applied mechanical stress. It can be concluded from the above experiments that the analog reference voltage varies with mechanical stress, whereas the virtual reference value VR is less sensitive to mechanical stress.

Tests have shown that, using the techniques of the present invention, the analog voltage to be measured can be compensated for temperature variations in the range from −50° C. to +170° C.,
with an absolute accuracy corresponding to about ±1.6° C. when using a 12 bit ADC, or
with an absolute accuracy corresponding to about ±0.40° C. when using a 14 bit ADC, or
with an absolute accuracy corresponding to about ±0.10° C. when using a 16 bit ADC.

As can be appreciated from FIG. 10(a) to FIG. 11(d), the influence from mechanical stress becomes particularly relevant when the compensation needs to have a tolerance corresponding to a temperature variation of at most ±0.20° C., or at most ±0.10° C. Thus, assuming that package stress has the same influence as a temperature variation of about ±0.10° C., using the techniques of the present invention, the analog voltage to be measured can be compensated for temperature and for mechanical stress, in the range from −50° C. to +170° C.,
with an absolute accuracy corresponding to about ±1.7° C. when using a 12 bit ADC, or
with an absolute accuracy corresponding to about ±0.50° C. when using a 14 bit ADC, or
with an absolute accuracy corresponding to about ±0.20° C. when using a 16 bit ADC.

While individual features are explained in different drawings and different embodiments of the present invention, it is contemplated that features of different embodiments can be combined, as would be obvious to the skilled person, when reading this document.

The invention claimed is:

1. A circuit for providing a digital value for an analog signal to be digitized, the circuit comprising:
at least one A/D convertor having a reference port for receiving a reference voltage, and an input port for receiving an analog voltage to be digitized;
a controller adapted for:
a) applying a first reference signal having a positive temperature coefficient to the input port of the at least one A/D convertor while applying a reference voltage to the reference port of the at least one A/D convertor, and obtaining a first digital reference value from the at least one A/D convertor;
b) applying a second reference signal having a negative temperature coefficient to the input port of the at least one A/D convertor while applying the same reference voltage as was used in step a) to the reference port of the at least one A/D convertor, and obtaining a second digital reference value from the at least one A/D convertor;
c) applying the analog signal to be measured or a signal derived therefrom to the input port of the at least one A/D convertor while applying the same reference voltage as was used in step a) to the reference port of the at least one A/D convertor, and obtaining a raw digital signal value from the at least one A/D convertor;
d) calculating the digital value for the analog signal to be digitized in the digital domain using a mathematical function of the first digital reference value, and the second digital reference value, and the raw digital signal value;
wherein step d) comprises calculating the digital value for the analog signal to be digitized using the following formula:

$$VABS=(C*VIN/V1)/[(\alpha*VPTAT/V2)+(VBE/V3)]$$

wherein VABS is a digital representation of the absolute voltage of the analog signal to be digitized, and VPTAT is the first digital reference value, and VBE is the second digital reference value, and VIN is the raw digital signal value, and V1, V2, V3 are digital values equal to 1 or obtained by measurement of a stable reference signal using the at least one analog to digital convertor, said stable reference signal derived from the same reference voltage as was used in step a).

2. The circuit according to claim 1, further comprising:
a first reference block for providing the first reference signal having the positive temperature coefficient, and
a second reference block for providing the second reference signal having the negative temperature coefficient, and
a third reference block for providing the reference voltage.

3. The circuit according to claim 1, wherein the third reference block is adapted for providing a bandgap voltage as the reference voltage; and/or
wherein the third reference block comprises a sample-and-hold block having an input adapted for receiving a voltage, and having an output connected to the reference port of the at least one ADC, and
wherein the controller is further adapted for configuring the sample-and-hold block to capture a sample of said voltage before performing step a) to c), and for holding this value while performing step a) to c).

4. The circuit according to claim 1, further comprising a routing network adapted for selective routing the first reference signal having a positive temperature coefficient, and the second reference signal having a negative temperature coefficient, and the analog signal to be digitized to said at least one input port; and
wherein the controller is further adapted for:
configuring the routing network to route the first reference signal to the input port of the at least one A/D convertor in step a); and for
configuring the routing network to route the second reference signal to the input port of the at least one A/D convertor in step b); and for configuring the routing network to route the analog signal to be measured or a signal derived therefrom to the input port of the at least one A/D convertor in step c).

5. The circuit according to claim 1, wherein the controller is adapted for performing step a) and b) at a first frequency, and for performing step c) and d) at a second frequency at least 5 times higher than the first frequency.

6. The circuit according to claim 1, wherein the circuit contains a single ADC; and
wherein step d) comprises calculating the digital value for the analog signal to be digitized using the following formula:

$$VABS=C*VIN/(\alpha*VPTAT+VBE)$$

wherein VABS is a digital representation of the absolute voltage of the analog signal to be digitized, and wherein VPTAT is the first digital reference value, and VBE is the second digital reference value, and VIN is the raw digital signal value, and a and C are predetermined constants.

7. The circuit according to claim 1, wherein the circuit comprises a first A/D convertor and a second A/D convertor and a third A/D convertor, each having a reference port adapted for receiving the same reference voltage; and
wherein the circuit further comprises an attenuator circuit adapted for attenuating the reference voltage and for providing an attenuated signal; and
wherein the routing network is adapted for selectively routing one of the first reference signal and the attenuated signal to the first A/D convertor, and for selectively routing one of the second reference signal and the attenuated signal to the second A/D convertor, and for selectively routing one of the analog voltage signal to be digitized and the attenuated signal to the third A/D convertor; and
wherein the controller is further adapted for:
e) configuring the routing network to route the attenuated signal to the input port of the first A/D convertor, and obtaining a first attenuation value while applying the same reference voltage as used in step a) to step c) to the reference port of the first A/D convertor;
f) configuring the routing network to route the attenuated signal to the input port of the second A/D convertor, and obtaining a second attenuation value while applying the same reference voltage as used in step a) to step c) to the reference port of the second A/D convertor;
g) configuring the routing network to route the attenuated signal to the input port of the third A/D convertor, and for obtaining a third attenuation value while applying the same reference voltage as used in step a) to step c) to the reference port of the third A/D convertor;
and wherein step d) comprises calculating the digital value for the analog signal to be digitized using the following formula or an equivalent formula:

$$VABS=C*(VIN/VX3)/[\alpha*(VPTAT/VX1)+(VBE/VX2)]$$

wherein VABS is a digital representation of the absolute voltage of the analog signal to be digitized, and wherein VPTAT is the first digital reference value, and VBE is the second digital reference value, and VIN is the raw digital signal value, and VX1 is the first attenuation value, and VX2 is the second attenuation value, and VX3 is the third attenuation value, and a and C are predetermined constants.

8. The circuit according to claim 1, wherein the circuit contains a single ADC; and
wherein the circuit further comprises an analog amplifier for amplifying the analog voltage to be digitized; and
wherein the circuit further comprises an attenuator circuit adapted for attenuating the reference voltage thereby providing an attenuated signal; and
wherein the routing network is adapted for selectively routing the first reference signal through a first path with unity gain to the A/D convertor for obtaining the first reference value in step a), and
for selectively routing the second reference signal through a second path with unity gain to the A/D convertor for obtaining the second reference value of step b), and
for selectively routing the analog voltage signal to be digitized through a third path containing the amplifier to the A/D convertor for obtaining the raw digital signal value of step c), and
for selectively routing the attenuated signal through a fourth path with unity gain to the A/D convertor for obtaining a first attenuation value, and
for selective routing the attenuated signal through a fifth path containing the amplifier to the A/D convertor for obtaining a second attenuation value; and
wherein the controller is further adapted for:
e) configuring the routing network to route the attenuated signal through said fourth path, and obtaining the first attenuation value while applying the same reference voltage as used in step a) to step c) to the reference port of the A/D convertor and to an input of the attenuator;
f) configuring the routing network to route the attenuated signal through said fifth path, and obtaining the second attenuation value while applying the same reference voltage as used in step a) to step c) to the reference port of the A/D convertor and to an input of the attenuator;
and wherein step d) comprises calculating the digital value for the analog signal to be digitized using the following formula:

$$VABS=C*VIN*(VX/VY)/(\alpha*VPTAT+VBE)$$

wherein VABS is a digital representation of the absolute voltage of the analog signal to be digitized, and wherein VPTAT is the first digital reference value, and VBE is the second digital reference value, and VIN is the raw digital signal value, and VX is the first attenuation value, and VY is the second attenuation value, and a and C are predetermined constants.

9. The circuit according to claim 1, wherein the at least one analog-to-digital convertor has a resolution of at least 12 bits.

10. The circuit according to claim 1, wherein the at least one analog-to-digital convertor has a resolution of at least 14 bit.

11. The circuit according to claim 1, wherein the at least one analog-to-digital convertor has a resolution of at least 16 bit.

12. A device, comprising:
a sensor circuit for measuring a physical quantity and for providing an analog sensor signal related to said physical quantity;
a circuit according to claim 1, for digitizing said analog sensor signal, and for calculating the absolute voltage value indicative of a magnitude of said physical quantity.

13. The device according to claim 12, wherein the device is a handheld pressure sensor device, or wherein the device is a handheld temperature sensor device.

14. The device according to claim 12, further comprising a display; and wherein the controller is further adapted for driving the display or configuring the display or sending information to the display for generating a visible representation of the digital value.

15. A computer implemented method of determining a digital value for an analog signal to be digitized, as can be performed by a controller as a part of a circuit that further comprises at least one A/D convertor having a reference port for receiving a reference voltage, and an input port for receiving an analog voltage to be digitized; the method comprising:

a) providing a first reference signal having a positive temperature coefficient to the input port of the at least one A/D convertor, and applying a reference voltage to the reference port of the at least one A/D convertor, and obtaining a first digital reference value from the at least one A/D convertor;

b) providing a second reference signal having a negative temperature coefficient to the input port of the at least one A/D convertor, and applying the same reference voltage to the reference port of the at least one A/D convertor, and obtaining a second digital reference value from the at least one A/D convertor;

c) providing the analog signal to be measured or a signal derived therefrom to the input port of the at least one A/D convertor, and applying the same reference voltage to the reference port of the at least one A/D convertor, and obtaining a raw digital signal value from the at least one A/D convertor;

d) calculating the digital value for the analog signal to be digitized in the digital domain as a mathematical function of the first digital reference value, and the second digital reference value, and the raw digital signal value;

wherein step d) comprises calculating the digital value for the analog signal to be digitized using the following formula:

$$VABS=(C*VIN/V1)/[(\alpha*VPTAT/V2)+(VBE/V3)]$$

wherein VABS is a digital representation of the absolute voltage of the analog signal to be digitized, and VPTAT is the first digital reference value, and VBE is the second digital reference value, and VIN is the raw digital signal value, and V1, V2, V3 are digital values equal to 1 or obtained by measurement of a stable reference signal using the at least one analog to digital convertor, said stable reference signal derived from the same reference voltage as was used in step a).

16. The method according to claim 15, wherein step d) comprises calculating the digital value for the analog signal to be digitized using the following formula:

$$VABS=C*VIN/(\alpha*VPTAT+VBE)$$

wherein VABS is a digital representation of the absolute voltage of the analog signal to be digitized, and VPTAT is the first digital reference value, and VBE is the second digital reference value, and VIN is the raw digital signal value, and a and C are predetermined constants.

17. A circuit for providing a digital value for an analog signal to be digitized, the circuit comprising:

at least one A/D convertor having a reference port for receiving a reference voltage, and an input port for receiving an analog voltage to be digitized;

a controller adapted for:

a) applying a first reference signal having a positive temperature coefficient to the input port of the at least one A/D convertor while applying a reference voltage to the reference port of the at least one A/D convertor, and obtaining a first digital reference value from the at least one A/D convertor;

b) applying a second reference signal having a negative temperature coefficient to the input port of the at least one A/D convertor while applying the same reference voltage as was used in step a) to the reference port of the at least one A/D convertor, and obtaining a second digital reference value from the at least one A/D convertor;

c) applying the analog signal to be measured or a signal derived therefrom to the input port of the at least one A/D convertor while applying the same reference voltage as was used in step a) to the reference port of the at least one A/D convertor, and obtaining a raw digital signal value from the at least one A/D convertor;

d) calculating the digital value for the analog signal to be digitized in the digital domain using a mathematical function of the first digital reference value, and the second digital reference value, and the raw digital signal value;

wherein the circuit comprises a first A/D convertor and a second A/D convertor and a third A/D convertor, each having a reference port adapted for receiving the same reference voltage; and wherein the circuit further comprises an attenuator circuit adapted for attenuating the reference voltage and for providing an attenuated signal; and wherein the routing network is adapted for selectively routing one of the first reference signal and the attenuated signal to the first A/D convertor, and for selectively routing one of the second reference signal and the attenuated signal to the second A/D convertor, and for selectively routing one of the analog voltage signal to be digitized and the attenuated signal to the third A/D convertor; and wherein the controller is further adapted for:

e) configuring the routing network to route the attenuated signal to the input port of the first A/D convertor, and obtaining a first attenuation value while applying the same reference voltage as used in step a) to step c) to the reference port of the first A/D convertor;

f) configuring the routing network to route the attenuated signal to the input port of the second A/D convertor, and obtaining a second attenuation value while applying the same reference voltage as used in step a) to step c) to the reference port of the second A/D convertor;

g) configuring the routing network to route the attenuated signal to the input port of the third A/D convertor, and for obtaining a third attenuation value while applying the same reference voltage as used in step a) to step c) to the reference port of the third A/D convertor;

and wherein step d) comprises calculating the digital value for the analog signal to be digitized using the following formula:

$$VABS=C*(VIN/VX3)/[\alpha*(VPTAT/VX1)+(VBE/VX2)]$$

wherein VABS is a digital representation of the absolute voltage of the analog signal to be digitized, and wherein VPTAT is the first digital reference value, and VBE is the second digital reference value, and VIN is the raw digital signal value, and VX1 is the first attenuation value, and VX2 is the second attenuation value, and VX3 is the third attenuation value, and a and C are predetermined constants.

18. A circuit for providing a digital value for an analog signal to be digitized, the circuit comprising:
   at least one A/D convertor having a reference port for receiving a reference voltage, and an input port for receiving an analog voltage to be digitized;
   a controller adapted for:
   a) applying a first reference signal having a positive temperature coefficient to the input port of the at least one A/D convertor while applying a reference voltage to the reference port of the at least one A/D convertor, and obtaining a first digital reference value from the at least one A/D convertor;
   b) applying a second reference signal having a negative temperature coefficient to the input port of the at least one A/D convertor while applying the same reference voltage as was used in step a) to the reference port of the at least one A/D convertor, and obtaining a second digital reference value from the at least one A/D convertor;
   c) applying the analog signal to be measured or a signal derived therefrom to the input port of the at least one A/D convertor while applying the same reference voltage as was used in step a) to the reference port of the at least one A/D convertor, and obtaining a raw digital signal value from the at least one A/D convertor;
   d) calculating the digital value for the analog signal to be digitized in the digital domain using a mathematical function of the first digital reference value, and the second digital reference value, and the raw digital signal value;
   wherein the circuit contains a single ADC; and
   wherein the circuit further comprises an analog amplifier for amplifying the analog voltage to be digitized; and
   wherein the circuit further comprises an attenuator circuit adapted for attenuating the reference voltage thereby providing an attenuated signal; and
   wherein the routing network is adapted for selectively routing the first reference signal through a first path with unity gain to the A/D convertor for obtaining the first reference value in step a), and
   for selectively routing the second reference signal through a second path with unity gain to the A/D convertor for obtaining the second reference value of step b), and
   for selectively routing the analog voltage signal to be digitized through a third path containing the amplifier to the A/D convertor for obtaining the raw digital signal value of step c), and
   for selectively routing the attenuated signal through a fourth path with unity gain to the A/D convertor for obtaining a first attenuation value, and
   for selective routing the attenuated signal through a fifth path containing the amplifier to the A/D convertor for obtaining a second attenuation value; and
   wherein the controller is further adapted for:
   e) configuring the routing network to route the attenuated signal through said fourth path, and obtaining the first attenuation value while applying the same reference voltage as used in step a) to step c) to the reference port of the A/D convertor and to an input of the attenuator;
   f) configuring the routing network to route the attenuated signal through said fifth path, and obtaining the second attenuation value while applying the same reference voltage as used in step a) to step c) to the reference port of the A/D convertor and to an input of the attenuator;
   and wherein step d) comprises calculating the digital value for the analog signal to be digitized using the following formula:

$$VABS=C*VIN*(VX/VY)/(\alpha*VPTAT+VBE)$$

wherein VABS is a digital representation of the absolute voltage of the analog signal to be digitized, and wherein VPTAT is the first digital reference value, and VBE is the second digital reference value, and VIN is the raw digital signal value, and VX is the first attenuation value, and VY is the second attenuation value, and a and C are predetermined constants.

* * * * *